United States Patent [19]
Gilbert

[11] Patent Number: 6,122,497
[45] Date of Patent: Sep. 19, 2000

[54] RF MIXER WITH INDUCTIVE DEGENERATION

[75] Inventor: Barrie Gilbert, Portland, Oreg.

[73] Assignee: Analog Devices, Inc., Norwood, Mass.

[21] Appl. No.: 08/918,728

[22] Filed: Aug. 21, 1997

[51] Int. Cl.[7] .................................................. H04B 1/28
[52] U.S. Cl. .......................... 455/333; 455/293; 455/319
[58] Field of Search .................................... 455/333, 293, 455/323, 326, 319, 280

[56] References Cited

U.S. PATENT DOCUMENTS

| | | | |
|---|---|---|---|
| 4,230,956 | 10/1980 | Steinbrecher | 307/257 |
| 4,626,770 | 12/1986 | Price, Jr. | 323/313 |
| 4,723,110 | 2/1988 | Voorman | 330/252 |
| 4,727,596 | 2/1988 | Jaffer | 455/326 |
| 5,043,674 | 8/1991 | Bonaccio et al. | 330/257 |
| 5,107,134 | 4/1992 | Itoh | 307/254 |
| 5,343,163 | 8/1994 | Linderet al. | 330/252 |
| 5,379,457 | 1/1995 | Nguyen | 455/326 |
| 5,497,123 | 3/1996 | Main et al. | 330/257 |
| 5,559,457 | 9/1996 | Uda et al. | 455/333 |
| 5,805,987 | 9/1998 | Kamase | 455/333 |

FOREIGN PATENT DOCUMENTS

| | | |
|---|---|---|
| 0040273 | 5/1980 | European Pat. Off. . |
| 109081 | 5/1984 | European Pat. Off. . |

OTHER PUBLICATIONS

Kimura, A Bipolar Four–Quadrant Analog Quarter–Square Multiplier Consisting of Unbalanced Emitter–Coupled Pairs and Expansion of Its Input Ranges, IEEE Journal of Solid–State Circuits, vol. 29, No. 1, Jan. 1994.

Kimura, "Some Circuit Design Techniques Using Two Cross–Coupled, Emitter–Coupled Pairs", IEEE Transactions On Circuits and Systems 1: Fundamental Theory and Applications, vol. 41, No. 5, May 1994 pp. 411–423.

Brokaw, A. Paul, "A Simple Three–Terminal IC Bandgap Reference," IEEE Journal of Solid–State Circuits, vol. SC–9, No. 6, Dec. 1974 pp. 388–393.

Primary Examiner—Daniel S. Hunter
Assistant Examiner—Thuan T. Nguyen
Attorney, Agent, or Firm—Marger Johnson & McCollom, P.C.

[57] ABSTRACT

An RF mixer provides extended dynamic range with reduced noise by utilizing degeneration inductors in the RF input section of a doubly balanced mixer. Degeneration inductors are also utilized in a mixer having a class AB input section. A current mirror in the class AB input section is also inductively degenerated for further noise reduction. The input section is biased by an all-NPN bandgap reference cell which is tightly integrated into the input section so as to reduce the power supply voltage required for the reference cell. The mixer can be optimized for wide input voltage ranges or low distortion.

22 Claims, 14 Drawing Sheets

RF MIXER WITH INDUCTIVE DEGENERATION

FIELD OF THE INVENTION

This invention relates generally to analog circuits and more particularly to radio frequency (RF) mixers. This application discloses various improvements to the subject matter disclosed in co-pending U.S. patent application Ser. No. 08/377,752 which has a common assignee with the present application, and which is herein incorporated by reference.

DESCRIPTION OF THE RELATED ART

A simple mixer is shown in FIG. 1. This prior art mixer is known as a singly-balanced mixer. The singly-balanced mixer 10 includes a differential pair of transistors (Q2, Q3) and a common-base transistor (Q1) connected to the emitters thereof. A constant current source 12 is connected in series with common-base transistor Q1 to provide a quiescent current to the mixer 10. This quiescent current ($I_z$) is the current flowing through the common-base transistor Q1 when no RF signal is applied to an RF input terminal 14 coupled between the common-base transistor Q1 and the current source 12.

The mixer 10 includes a local oscillator interface 16, which includes two input terminals, each connected to the base of a respective transistor in the differential pair, to which a local oscillator voltage (LO) is applied. The LO voltage is ideally a square wave, but is closer to a sinusoidal waveform at typical operating frequencies. In the absence of an RF input signal, the oscillation of the local oscillator voltage LO causes the quiescent current $I_z$ to commutate between the two transistors (Q2, Q3) of the differential pair. This commutation action produces an output signal (IF) that includes sum and difference frequencies.

The RF input signal is typically a signal having a frequency between 1 MHz to several GHz. As described above, this RF signal is "mixed" with the local oscillator voltage to produce the IF output signal. The RF input voltage $V_{RF}$ produces an input current $I_{RF}$ into node 18 between the common-base transistor Q1 and the constant current source 12. The current through the transistor Q1 ($I_{Q1}$) is thus the difference between $I_z$ and $I_{RF}$. Accordingly, as the input current $I_{RF}$ changes the current though transistor Q1 is modulated thereby.

Unfortunately, the relationship between the current $I_{Q1}$ and the input current $I_{RF}$ is nonlinear. Even small amplitudes of the input voltage $V_{RF}$ can produce large non-linearities in the variations in the transistor current $I_{Q1}$. Ultimately, when the input voltage $V_{RF}$ reaches a certain magnitude, the mixer 10 effectively operates as a halfway rectifier due to transistor Q1 cutting off on positive excursions of $V_{RF}$. This nonlinearity, which is predominently even-order, of the common-base transistor Q1 produces unacceptable levels of intermodulation distortion in the IF output signal.

Another problem with the singly-balanced mixer is that a separate notch or band stop filter is needed to remove the local oscillator component from the IF signal. Another prior art mixer design, the so-called doubly-balanced mixer, as shown generally at 20 in FIG. 2, eliminates the need for the band stop filter by using two differential pairs cross-coupled so as to cancel the local oscillator component from the IF output signal. The operation of the doubly-balanced or "Gilbert" mixer, as it is known in the art, is well known. Although the Gilbert mixer does cancel the local oscillator component in the IF output signal, it does little to improve the basically-nonlinear performance of the singly-balanced mixer 10 of FIG. 1. It also has a limited dynamic range due to nonlinearities, which are now largely odd-order in nature. Moreover, the Gilbert mixer requires a matching network at its RF input to achieve low noise when operating from a typical source impedance of 50 ohms.

Accordingly, a need remains for a mixer having improved linearity, low intermodulation distortion, good input matching, extended dynamic range, low power supply operation, and low noise.

SUMMARY OF THE INVENTION

It is, therefore, an object of the invention to provide a mixer having improved operating characteristics over the above-described prior art mixers.

To achieve these and other objects, an RF mixer constructed in accordance with the present invention provides extended dynamic range with reduced noise by utilizing degeneration inductors in the RF input section of a doubly balanced mixer. Degeneration inductors are also utilized in a mixer having a class AB input section. A current mirror in the class AB input section is also inductively degenerated for further noise reduction. The input section is biased by an all-NPN bandgap reference cell which is tightly integrated into the input section so as to reduce the power supply voltage required for the reference cell. The mixer can be optimized for wide input voltage ranges or low distortion.

One aspect of the present invention is an RF mixer comprising: a mixer core having an LO port for receiving an LO signal, an IF port for providing an IF output signal, and an input port having an input terminal for receiving a current signal; and an RF input section coupled to the input terminal for providing the current signal responsive to an RF input signal; wherein the RF input section includes: a transistor coupled to the input terminal, and an inductor coupled to the transistor to extend the dynamic range of the mixer.

Another aspect of the present invention is an RF mixer comprising: a mixer core having a first input terminal for receiving a first current signal and a second input terminal for receiving a second current signal; a first subcell coupled to the first input terminal of the mixer core to provide the first current signal to the mixer core responsive to an RF input signal, the first subcell having a first transistor and a first inductor coupled to the first transistor to extend the dynamic range of the mixer; and a second subcell coupled to the second input terminal of the mixer core to provide a second current signal to the mixer core responsive to an RF input signal, the second subcell having a second transistor and a second inductor coupled to the first transistor to extend the dynamic range of the mixer.

A further aspect of the present invention is a current mirror comprising: a first transistor having a first terminal for receiving an input signal, a second terminal coupled to the first terminal of the first transistor to cause the first transistor to operate as a diode, and a third terminal; a first inductor coupled between the third terminal of the first transistor and a common node to reduce the noise of the current mirror; a second transistor having a first terminal for transmitting an output signal, a second terminal coupled to the first terminal of the first transistor, and a third terminal; and a second inductor coupled between the third terminal of the second transistor and a common node to reduce the noise of the current mirror.

Yet another aspect of the present invention is an RF amplifier comprising: a first transistor coupled between a first node and a common node in a diode configuration; a second transistor having a first terminal for transmitting an output signal, a second terminal, and a third terminal coupled to a second node; a passive component coupled between the first and second nodes; a delta-Vbe cell referenced to the common node and having first and second load input terminals for loading the cell, and a sense terminal coupled to the first node for sensing the voltage across the first transistor; a third transistor having a first terminal coupled to the common node, a second terminal coupled to the second load input terminal, and a third terminal coupled to the second terminal of the second transistor to provide a bias signal to the second transistor.

The foregoing and other objects, features and advantages of the invention will become more readily apparent from the following detailed description of a preferred embodiment of the invention which proceeds with reference to the accompanying drawings.

DETAILED DESCRIPTION

Figure 3:
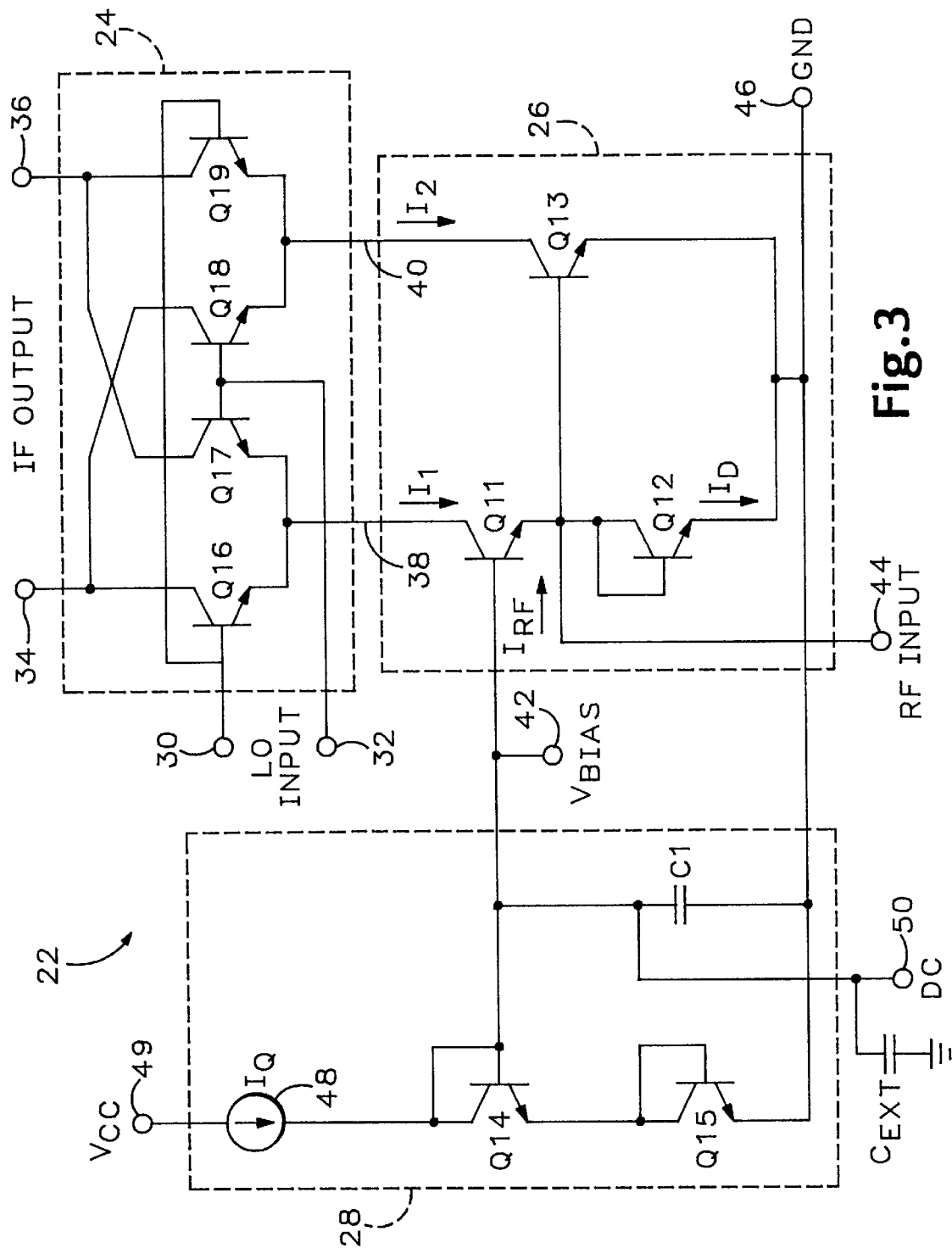
FIG. 3 is a schematic drawing of a basic mixer form according to the invention.

Referring now to FIG. 3, a mixer 22 according to the invention is shown. The mixer 22 includes a mixer core 24, an RF input section 26, and a biasing circuit 28. The mixer core includes a local oscillator (LO) interface for receiving a local oscillator signal (LO). The LO interface includes input terminals 30 and 32. The mixer core 24 also includes an IF output comprised of terminals 34 and 36 for providing an IF output signal (IF).

Figure 1:
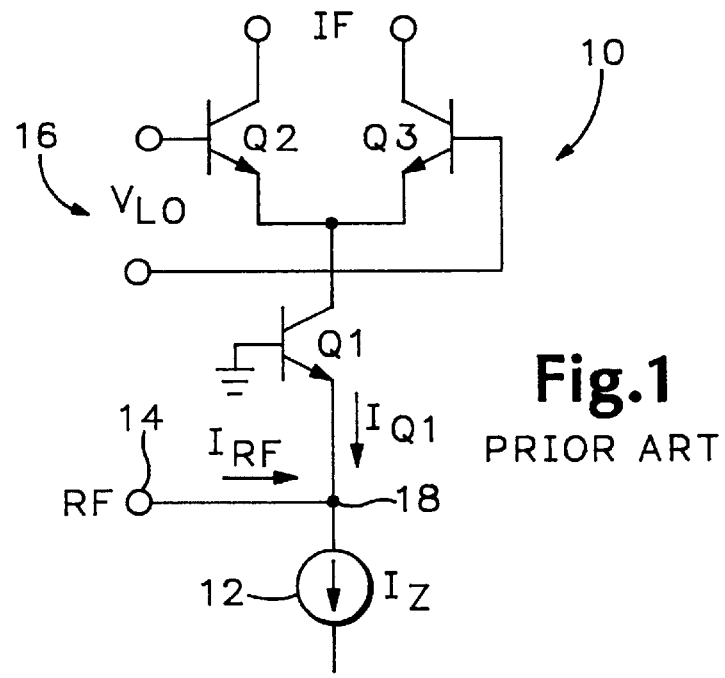
FIG. 1 is a schematic drawing of a prior art singly-balanced mixer.
Figure 2:
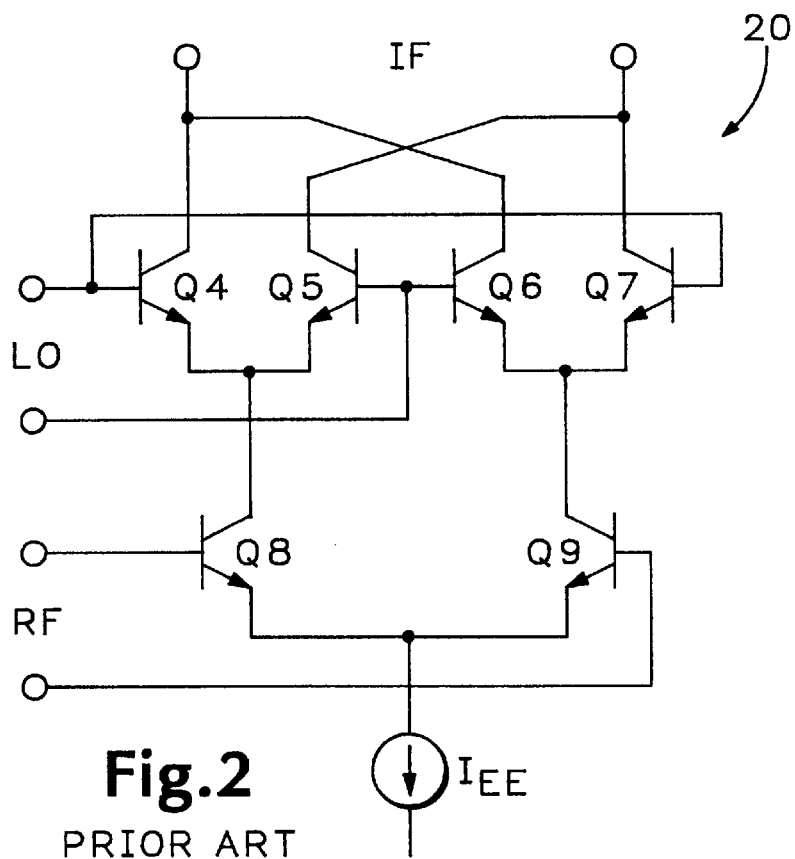
FIG. 2 is a schematic drawing of a prior art doubly-balanced mixer.

The mixer core 24 includes four transistors Q16–Q19 connected as in the prior art doubly-balanced mixer, i.e., Q4–Q7 respectively. The mixer core 24, rather than being coupled to a differential pair of transistors, as in FIG. 2, is coupled to the RF input section 26 of the invention. The RF input section 26 is coupled to the mixer core 24 at a first input 38 for supplying a first current ($I_1$) to a first differential pair (Q16–Q17) and a second input 40 for supplying a second current ($I_2$) to a second differential pair (Q18–Q19) of the mixer core 24. As will be described further herein below, the first and second currents are complementary for small RF input signal variations.

The RF input section 26 includes two primary components: a transistor (Q11), operating in a common-base configuration, and a current mirror (Q12–Q13). The transistor Q11 includes a first terminal connected to the first input 38 of the mixer core 24, a second terminal coupled to a bias input 42 of the RF input section 24, and a third terminal coupled to an RF input 44. In the preferred embodiment, transistor Q11 is a bipolar junction transistor (BJT), wherein the first, second, and third terminals correspond to the collector, base, and emitter, respectively. However, as will be described further below, the invention is not limited to bipolar junction transistors. The collector of the transistor Q11 provides the first current $I_1$ to the mixer core 24. The quiescent level of the first current $I_1$ is established by a bias voltage $V_{BIAS}$ supplied to the bias input 42 by the biasing circuit 28. A description of the biasing circuit 28 is included herein below. The emitter of transistor Q11 is coupled to the RF input 44 for receiving the RF input signal thereon. As in the case of the common base transistor of the singly-balanced mixer, the current through the transistor Q11 is directly responsive to the RF input signal.

The RF input section 26 also includes a current mirror comprised of transistors Q12 and Q13. Transistor Q12 is a diode-connected transistor having an anode coupled to the emitter of transistor Q11 and a cathode coupled to a common terminal 46 for receiving a common voltage, i.e., GND. The collector of transistor Q13 is coupled to the second input 40 of the mixer core 24 to supply the second current $I_2$ thereto. The base of transistor Q13 is coupled to the anode of the diode-connected transistor Q12 and the emitter of Q13 is coupled to the common terminal 46. As a result of this configuration, the voltage across the diode-connected to transistor Q12 is impressed upon the base-emitter junction of Q13. This results in the current through the diode-connected transistor $I_D$, i.e., approximately equal to $I_{RF}+I_1$ (ignoring the base current in Q11), being mirrored by current $I_2$.

Figure 14:
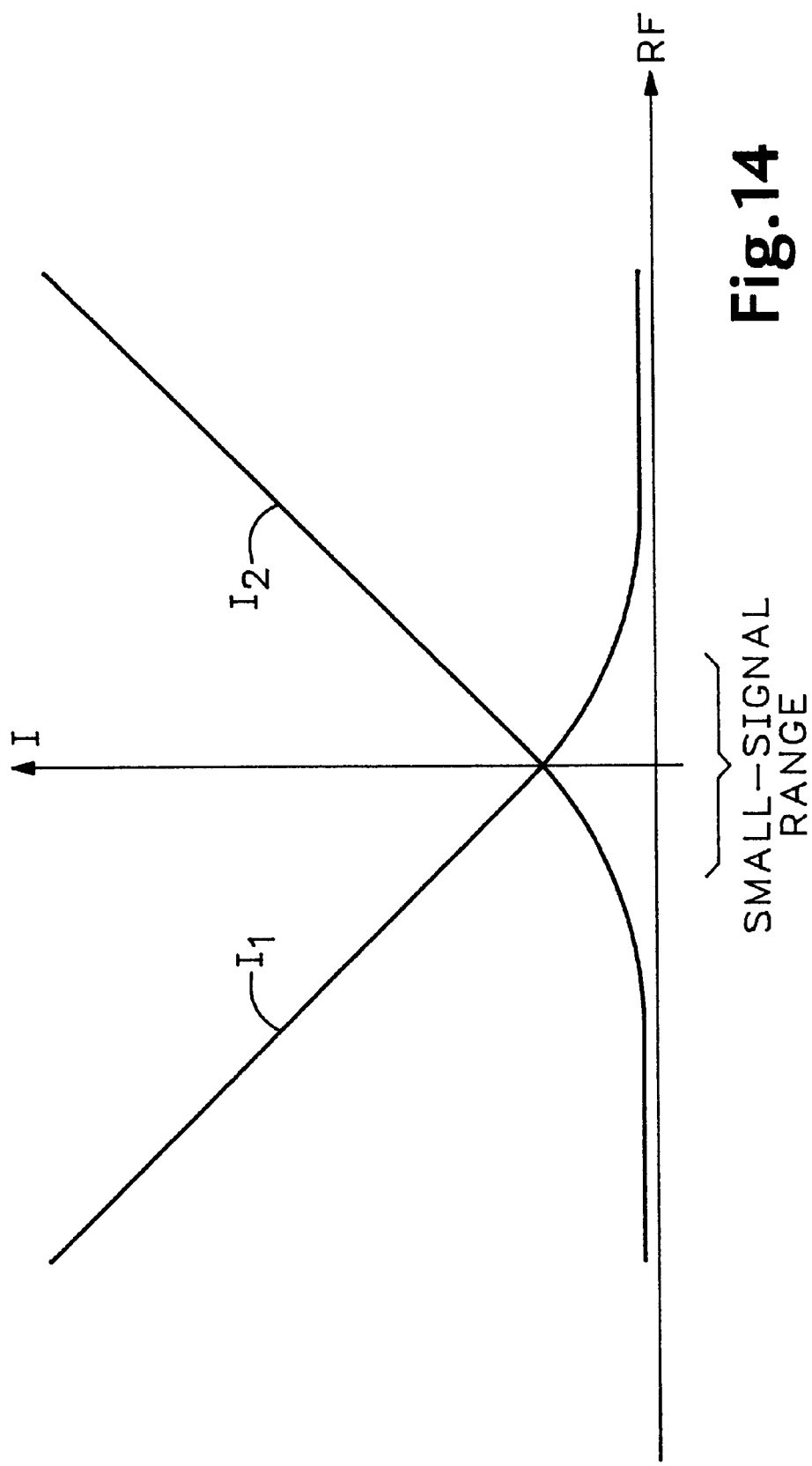
FIG. 14 is a plot of the first and second currents in the RF input section of FIG. 3 showing the complementary nature of the currents for small variations of the RF input signal, and the "Class AB" behavior for large variations of the RF input signal.

In response to signal current $I_{RF}$ applied to the RF input 44, the RF input section 26 produces two currents $I_1$ and $I_2$ that are complementary for small variations of this signal. This small-signal complementary relationship between the two currents $I_1$ and $I_2$ is shown in FIG. 14 in which $I_z$ is defined as the quiescent current in Q11 and Q12. As can be seen in FIG. 14, for small variations of the RF input signal, labeled small-signal range on FIG. 14, the currents $I_1$ and $I_2$ are complementary. Stated another way, for small signal variations the sum of $I_1$ and $I_2$ remain substantially constant. For large signal variations, however, currents $I_1$ and $I_2$ are no longer complementary but each becomes progressively a more linear function of the input currents. This extended signal range results in the improved large-signal linearity of the mixer.

The relationship between currents $I_1$ and $I_2$ shown in FIG. 14 ignores some of the practical effects of process variations and operating conditions such as finite β and supply voltage perturbations. These practical effects are addressed in turn herein below. However, before addressing those effects, the various embodiments of the biasing circuit of FIG. 3 are described.

Biasing Circuits

Referring again to FIG. 3, the biasing circuit 28 is shown coupled to the bias input 42 for supplying the bias voltage $V_{BIAS}$ thereto. The bias voltage $V_{BIAS}$ establishes a quiescent level of the first current $I_1$ and the quiescent current in Q12 and Q13 in the RF input section 26. There are several embodiments of the biasing circuit 28 as shown herein in FIGS. 3–6. The biasing circuit 28 shown in FIG. 3 includes a current source 48, a first diode-connected transistor (Q14) in series with the current source, and a second diode-connected transistor (Q15) in series with the first diode. The current source 48 provides a current $I_Q$ to the diodes, thereby establishing a bias voltage $V_{BIAS}$ equal to the total voltage drop across the two diode-connected transistors Q14 and Q15. The magnitude of the current $I_Q$ is chosen to produce the desired voltage across the two diode-connected transistors. The current $I_Q$, in one embodiment, is proportional to absolute temperature (PTAT). The voltage across each is equal to the base-emitter voltage ($V_{BE}$) which is a function of the collector current of the transistor. The two $V_{BE}$ voltage drops provide sufficient voltage to provide the voltage needed across transistors Q11 and Q12 of the RF input section to establish the quiescent bias currents.

The emitter area ratios of the diode-connected transistors in the biasing circuit (Q14, Q15) to the diode-connected transistor in the RF input section (Q12) can be modified to produce the desired relationship between $I_Q$ and $I_D$.

The biasing circuit 28 further includes a capacitor C1 coupled across the first and second diode connector transistors Q14 and Q15. The capacitor C1 ensures that the bias node has a low HF impedance. To further lower the bias node impedance an external pad 50 is coupled to the bias input 42 whereby an external capacitor $C_{EXT}$ can be coupled to the external pad 50. Typically, the external capacitor $C_{EXT}$ has a substantially larger capacitance (typically 0.1 μF) than the capacitance of the internal capacitor C1 (typically 20 pF).

Figure 4:
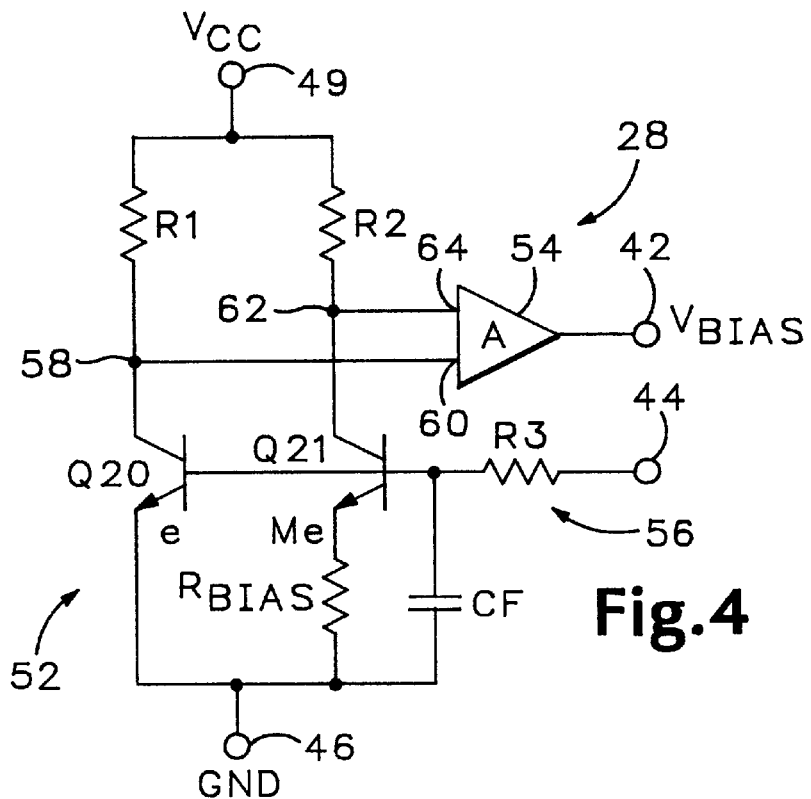
FIG. 4 is a schematic drawing of a first biasing circuit for the mixer of FIG. 3.

Referring now to FIG. 4, a second embodiment of the biasing circuit 28 is shown. This embodiment includes a proportional to absolute temperature (PTAT) cell, shown generally at 52, an operational amplifier 54, and a filter shown generally at 56. The PTAT cell 52 includes transistors Q20 and Q21 along with resistors R1, R2 and $R_{BIAS}$. The emitter areas of transistors Q20 and Q21 have a predetermined relationship. As shown in FIG. 4, the emitter area (Me) of transistor Q21 is M times the emitter area (e) of transistor Q20. It can readily be shown that this ratio produces a current ($I_{Q21}$) through the resistor $R_{BIAS}$ given by the following expression:

$$I_{Q21}=(V_T/R_{BIAS})\times 1nM$$

where $V_T$ is the thermal voltage (kT/q), which is approximately equal to 26 mV at 300° K. This current $I_{Q21}$ is thus proportional-to-absolute-temperature (PTAT).

The bases of transistors Q20 and Q21 are coupled to the RF input 44 via the filter 56. The filter 56, comprised of resistor R3 and capacitor CF, removes the RF signal and passes only the DC voltage present at the RF input 44. This allows the PTAT cell 52 to sense the DC voltage at the RF input 44. This DC voltage is impressed upon the base of transistor Q20, which thereby produces a corresponding current through resistor R1. The current R1 produces a corresponding voltage at node 58, which is provided to a first input 60 of the operational amplifier 54. The PTAT current through the transistor Q21, which is also dependent on the DC voltage, produces a corresponding voltage on node 62, which is presented to a second input 64 of the op amp 54. The op amp 54, which in a typical embodiment may include only a few transistors, produces the bias voltage $V_{BIAS}$ responsive to the voltages appearing on input 60 and 64.

Figure 5:
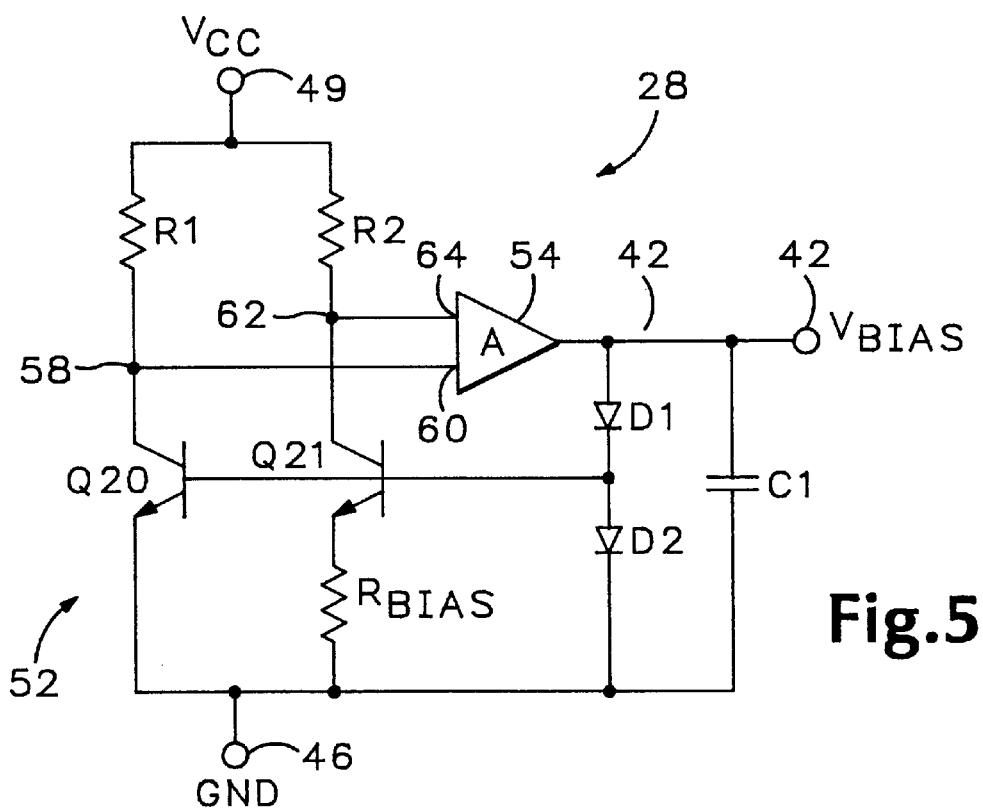
FIG. 5 is a schematic drawing of a second biasing circuit for the mixer of FIG. 3.

A third embodiment of the biasing circuit, shown in FIG. 5, adds two additional diodes D1 and D2 to the biasing circuit of FIG. 4. By using the diodes D1 and D2, the biasing circuit 28 can be decoupled from the RF input 44. Thus, the filter (resistor R3 and capacitor CF) of FIG. 4 is no longer required. The biasing circuit of FIG. 5 operates in substantially the same manner as the biasing circuit of FIG. 4, except that the voltage at the bases of transistors Q20 and Q21 is established by the voltage across diode D2 and not directly by the voltage across diode-connected transistor Q12 of the RF input section 26.

Alternatively, two resistors can be used in place of the two diodes D1 and D2 to establish the voltage at the bases of transistors Q20 and Q21. However, the diodes allow a lower current to be used to establish a low operating impedance at the bases of Q20, Q21.

Figure 6:
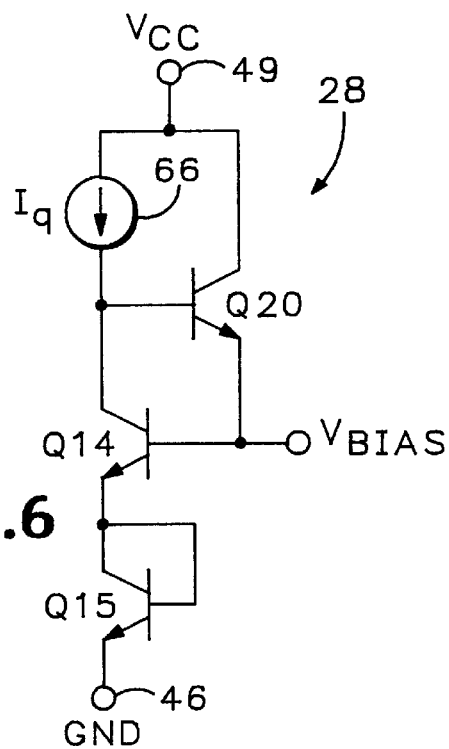
FIG. 6 is a schematic drawing of a third biasing circuit for the mixer of FIG. 3.

Referring now to FIG. 6, another embodiment of the biasing circuit 28 is shown. This embodiment uses a PTAT current instead of the base-emitter voltages to the bias voltage. The embodiment of FIG. 3 adds an emitter follower Q20 between the collector and base of the transistor Q14. By adding the emitter follower Q20 a smaller bias current $I_q$ can be used. The bias current $I_q$ is generated by a constant current source 66, which in one embodiment is formed using a lateral PNP transistor.

In most semiconductor processes, PNP transistors have low current gain (i.e., β). As a result, only NPN transistors can be used where large currents are required. The biasing circuits of FIGS. 3–6 are examples of biasing circuits which use primarily NPN transistors to provide the needed current gain. The emitter follower Q20 provides the needed current gain to drive the base of transistor Q11 of the RF input section 26. Absent the emitter follower Q20, as in FIG. 3, the current source would have to supply significantly more current. This current requirement would foreclose the ability to use a lateral PNP to form the current source in most bipolar processes. In one embodiment, the current source 66 supplies approximately 26 μA.

Because a significantly smaller current is flowing through the transistors Q14 and Q15, as compared to that flowing through transistors Q11 and Q12, the emitter area of transistor Q12 must be proportionally larger than the emitter area of Q50. In one embodiment, the emitter area of Q12 is approximately ten times larger than that of Q50. This assumes a current through the transistor Q12 of approximately 260 μA. If a different quiescent value of this current is chosen, the ratio would be modified accordingly.

In any practical realization, the device sizes of the transistors used in the RF input section 26 must be larger than those used in the biasing circuit to reduce the ohmic resistances of the RF input section devices.

RF Input Section

The following discussion describes several embodiments of the RF input section 26 of FIG. 3. These embodiments are shown in FIGS. 7–13. Each embodiment addresses a problem or limitation encountered in a practical implementation of the basic form of the RF input section 26 shown in FIG. 3. The embodiments shown in FIGS. 7–13 do not include the mixer core 24 or the biasing circuit 28 in order to focus on the particular modification to the basic form of the RF input section. In the complete realization of the mixer 22, however, both of these components are required. In addition, modifications to the basic biasing circuits shown in FIGS. 3–6 may need to be made to accommodate the changes to the RF input section described below.

Figure 7:
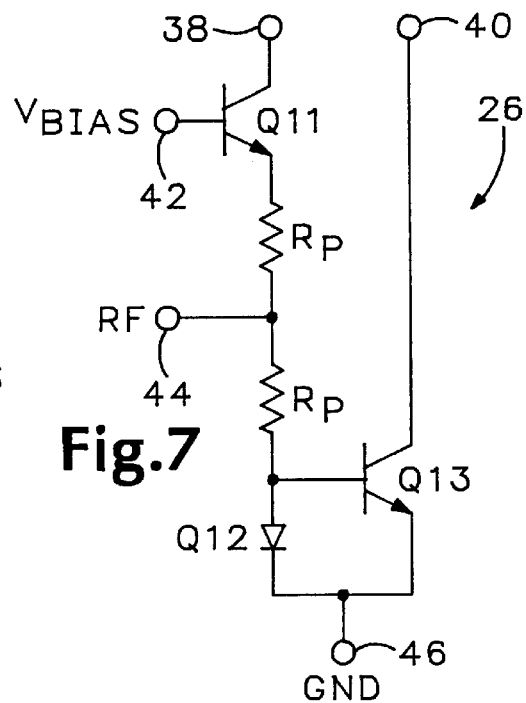
FIG. 7 is a schematic drawing of an RF input section for the mixer of FIG. 3.

Turning now to FIG. 7, a method and apparatus for providing a predetermined input impedance to the RF input signal for higher bias currents is shown. The method shown includes interposing a first padding resistor $R_P$ between the RF input 44 and the emitter of transistor Q11 and a second padding resistor $R_P$ between the RF input 44 and the anode of the diode-connected transistor Q12. The input impedance of each half-section is then equal to the sum of the padding resistance $R_P$ and the incremental resistance $(r_e)$ of the transistors Q11 and Q12, respectively. The input resistance $Z_{IN}$ of the RF input section is the parallel combination of these resistances. Assuming the incremental resistance $r_e$ of the transistors Q11 and Q12 are equal, the input impedance $Z_{IN}$ is given by the following equation:

$$Z_{IN}=(r_e+R_P)/2$$

Assuming $Z_{IN}$ is set equal to 50 ohms and substituting $V_T/I_C$ for the incremental resistance $r_e$, the required value of the padding resistor $R_P$ is equal to the following expression:

$$R_P=100 \text{ ohms}-V_T/I_c$$

where $I_c$ is here equal to the quiescent value of the current through transistors Q11 and Q12. The expression can then be used to select the optimal value of the padding resistance $R_P$ and the quiescent current $I_C$. In the preferred embodiment, $R_P$ is equal to 35 ohms and the current $I_C$ is equal to 397 μA. More fundamentally, $R_P$ is chosen so that the quiescent voltage drop across it due to the bias current is equal to $V_T/2$.

The biasing circuits shown in FIGS. 3–6 will need to be modified to account for the additional voltage across the padding resistors. To compensate for this voltage, an additional resistor must be used in the biasing circuit to match the voltage across the padding resistor.

Figure 8:
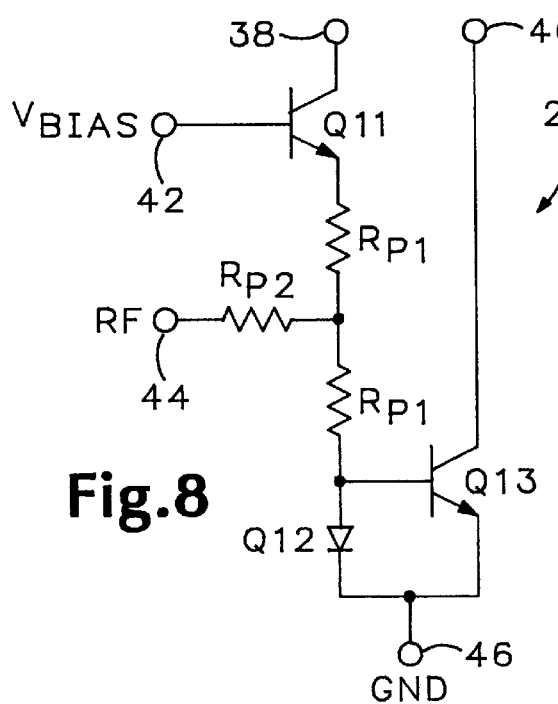
FIG. 8 is a schematic drawing of an RF input section for the mixer of FIG. 3.

Another method of providing predetermined input impedance is shown in FIG. 8. There a "Tee" resistance network is used. Here again, the values of resistors $R_{P1}$ and $R_{P2}$ are chosen to produce the desired input impedance, e.g., 50 Ω.

Figure 9:
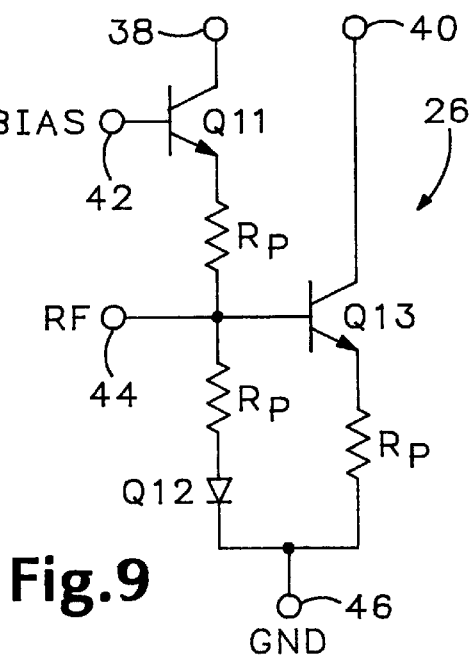
FIG. 9 is a schematic drawing of an RF input section for the mixer of FIG. 3.

The noise introduced by the current mirror transistor Q13 can be reduced by the introduction of an emitter degeneration resistor coupled between the emitter Q13 and the common terminal 46. This arrangement is shown in FIG. 9. In order to maintain the mirroring function of transistor Q13, the base of transistor Q13 is coupled to the RF input 44 and the emitter degeneration resistor $R_P$ has the same resistance as the padding resistor $R_P$ in series with the diode-connected transistor Q12. Alternatively, the positions of the diode-connected transistor Q12 and the second padding resistor $R_P$ can be interchanged, while still maintaining the mirroring function of transistor Q13.

Figure 10:
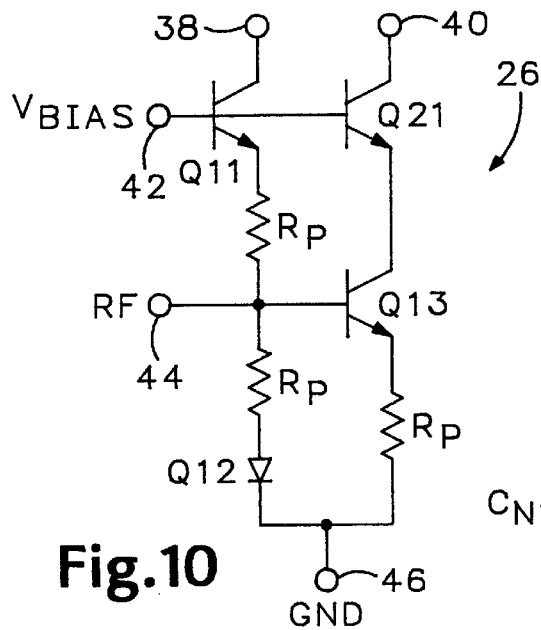
FIG. 10 is a schematic drawing of an RF input section for the mixer of FIG. 3.

A further embodiment of the RF input section 26 is shown in FIG. 10. The embodiment of FIG. 10 includes a cascode transistor Q21 interposed between the transistor Q13 and the second input 40 of the mixer core. The base of the cascode transistor Q21 is coupled to the bias input 42 of the RF input section to receive the bias voltage $V_{BIAS}$. The cascode transistor Q21 shields the mirror transistor Q13 from variations in the supply voltage. In addition, the cascode transistor Q21 helps to keep the needed sum of the base currents constat with variations in the signal currents, resulting in an essentially constant current required at the bias input 42. This is due to the complementary nature of the first and second currents provided to the mixer core by transistors Q11 and Q21, respectively, for small-signal conditions. The cascode transistor Q21 provides the further advantage of shielding the mirror transistor Q13 from spurious LO signals generated by the mixer core. Instead of being coupled to the mirror transistor Q13, LO signals from the mixer core are coupled to the bias input 42 via the parasitic capacitance between the base and collector of the cascode transistor and thus to the biasing capacitors $C_1$ and $C_{EXT}$, as shown in FIG. 3. This results in improved performance of the mixer.

Figure 11:
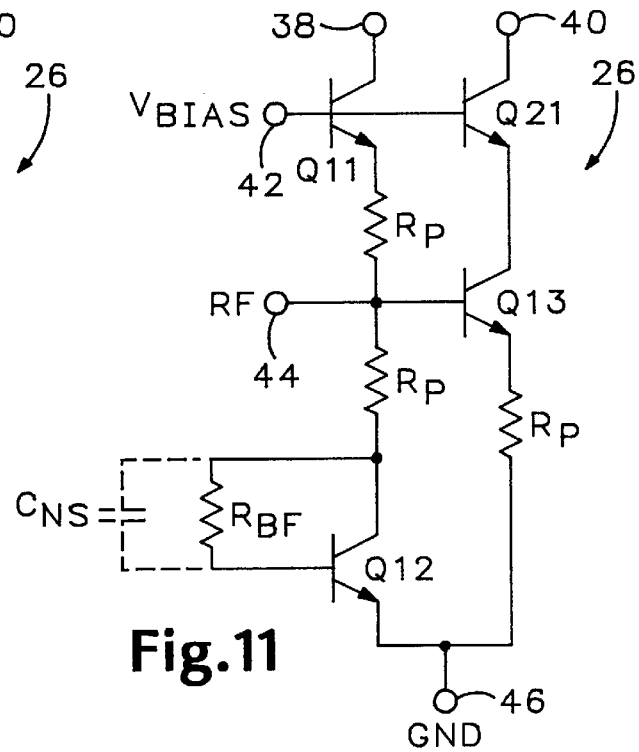
FIG. 11 is a schematic drawing of an RF input section for the mixer of FIG. 3.

A yet further embodiment of the RF input section 26 is shown in FIG. 11. The embodiment of FIG. 11 includes a resistor $R_{BF}$ interposed between the collector and base of the diode-connected transistor Q12 to improve the accuracy of the current mirror's gain in the presence of finite β. The resistor $R_{BF}$ raises the voltage at the base of transistor Q13, thereby increasing the current therethrough. It can be shown that the value of $R_{BF}$ is given by the following expression:

$$R_{BF}=2\times(r_e+R_P)$$

In the preferred embodiment, $R_{BF}$ is approximately 200 ohms. As a further modification, a noise suppressing capacitor $C_{NS}$ can be coupled in parallel with the resistor $R_{BF}$. Both components $C_{NS}$ and $R_{BF}$ are optional.

Figure 12:
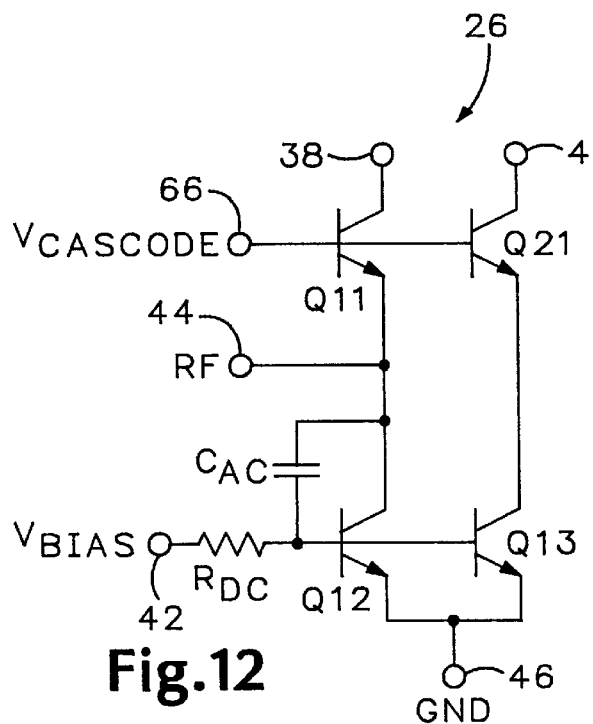
FIG. 12 is a schematic drawing of an RF input section for the mixer of FIG. 3.

Referring now to FIG. 12, another embodiment of the RF input section 26 is shown. This embodiment includes a capacitor $C_{AC}$ interposed between the base and the collector of the diode-connected transistor Q12 to AC couple the base and emitter terminals of transistor Q12 at high frequencies. The value of the capacitance $C_{AC}$ is selected so that the transistor Q12 will effectively be a diode-connected transistor at the RF frequency range, typically 10 MHz to 1 GHz. In this embodiment, the bias voltage $V_{BIAS}$ is coupled to the base of transistor Q12 via a resistor $R_{DC}$. The resistor $R_{DC}$ blocks the RF component; an RF choke could be substituted for the purposes of DC biasing The transistors Q11 and Q21 are then biased by a separate cascode voltage $V_{CASCODE}$ at a second bias input 66. This embodiment provides for greater flexibility in establishing the cascode voltage $V_{CASCODE}$. The embodiment of FIG. 12 can be modified in the manner as described above with reference to FIGS. 7–11 to overcome some of the limitations of the basic structure shown in FIG. 12.

Figure 13:
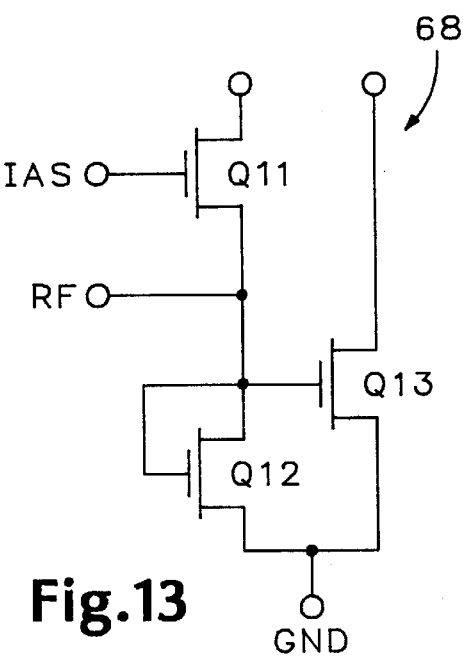
FIG. 13 is a schematic drawing of an RF input section for a mixer according to the invention using CMOS transistors.

The invention described herein is not limited to the use of NPN bipolar transistors, nor to the use of a bipolar technology. Instead, a mixer according to the invention can be formed using any number of different semiconductor processes and different types of transistors. By way of illustration, FIG. 13 shows an RF input section 68 formed using field-effect-transistors (FET). The use of FETs in place of BJTs eliminates the need to compensate for errors due to base current in the bipolar case since no gate current is required by the FETs. Further, $g_m$ "degeneration" is usually not required. However, impedance is no longer simply a function of bias current: the input impedance now depends on both the bias current and device geometry. Accordingly, the analysis described above must be modified to account for the dependence on device geometry.

All-NPN Biasing Circuits

Figure 19:
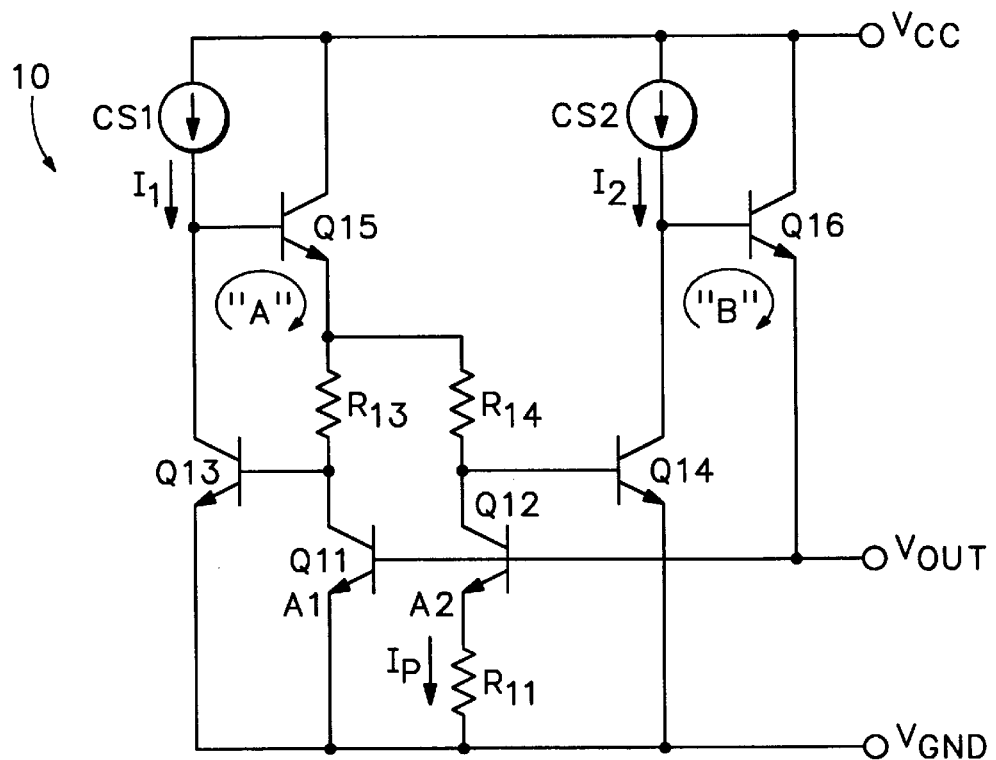
FIG. 19. is a schematic diagram of a prior art biasing circuit reference cell.

FIG. 19 shows a prior art biasing circuit reference cell which can be adapted for use with the RF input section 26 of FIG. 3. Referring to FIG. 19, the reference cell 10 is based on two transistors Q11 and Q12. NPN transistors Q11 and Q12 have emitter areas A1 and A2 respectively. The base terminals of Q11 and Q12 are connected together. The emitter of Q11 is connected to a common supply voltage line $V_{GND}$. The emitter of Q12 is connected to $V_{GND}$ through a resistor R11. NPN transistor Q15 supplies equal currents at equilibrium to transistors Q11 and Q12, whose collectors are connected to the emitter of Q15 through resistors R13 and R14 respectively. The collector of Q15 is connected to a positive supply voltage line $V_{cc}$.

An NPN transistor Q13 has its emitter connected to $V_{GND}$ and its base connected to the collector of Q11. The collector of Q13 is connected to the base of Q15. A current source CS1 is connected between $V_{cc}$ and the base of Q15. A current source CS2 is connected between $V_{cc}$ and the collector of Q14. Current sources CS1 and CS2 set the bias currents through Q13 and Q14.

The collector of an NPN transistor Q16 is connected to $V_{cc}$, and the emitter is connected to the base terminals of Q11 and Q12. The base of Q16 is connected to the collector of Q14.

Q11 and Q12 operate at different current densities J1 and J2, and therefore, different values of $V_{BE}$. As long as the current densities are maintained at constant values, $\Delta V_{BE}$ between Q11 and Q12 will be PTAT and shows up across R11. Thus, the current through R11, designated as $I_P$, is also PTAT.

Resistors R13 and R14, which have equal resistances in the preferred embodiment, form a load circuit for setting the current through Q11 and Q12. Transistors Q13 and Q14 serve two functions. First, they sense the voltage difference at the collectors of Q11 and Q12. Additionally, transistors Q13 and Q14 clamp the voltages at the collectors of Q11 and Q12 respectively at one $V_{BE}$ above the common supply voltage line $V_{GND}$. This clamping effect reduces the voltage consumed by transistors Q11 and Q12.

Transistors Q13 and Q15 and resistor R13 form a loop "A" which sets the voltage at the emitter of Q15, thereby maintaining the current through Q11 and Q12. Transistors Q14 and Q16 form a second loop "B" which drives the bases of Q11 and Q12 to balance the currents through the respective transistors. Because Q15 and Q16 are configured as emitter followers, they are both loadable as output nodes.

Different current densities can be established in Q11 and Q12 by fabricating the emitters different with areas and then operating Q11 and Q12 at the same current. The ratio of areas A2/A1 is referred to as the area ratio and is designated as A. If Q11 and Q12 are operated at the same current, $\Delta V_{BE}$ is given by:

$$\Delta V_{BE} = V_T \ln A$$

which, for an area ratio of 100, is approximately 120 millivolts (mV). This voltage is PTAT appears across R11. Using large values of A is beneficial because it reduces the sensitivity of the voltage to the ratio of A.

Turning now to current sources CS1 and CS2, if the base currents in Q15 and Q16 are ignored and I1 and I2 are made equal to a fixed value "I", then the currents through the collectors of Q13 and Q14 are also equal. Transistors Q13 and Q14 can also be given the same collector area so that $V_{BE}$ for both transistors are equal. The value of $V_{BE}$ is determined by the value of I, but the exact value is not particularly important as long as it does not drop so low as to force Q11 and Q12 out of the active region by pulling the voltage at the collectors of Q11 and Q12 too far below the voltage at the bases. Although in the strictest sense, Q11 and Q12 are considered to be in saturation when the voltage at the collector is lower than the voltage at the base, this does not significantly affect the operation of the circuit until the collector drops to about 400 mV below the base. Only then does significant current begin to flow due to the forward biasing of the collector-base junction. This is a very useful characteristic because it means that a small amount of common resistance can be placed in the emitters of Q11 and Q12 to raise the voltage of the emitters slightly.

If resistors R13 and R14 are selected to be equal and assigned the value $R_c$, then with $V_{BE}$ of Q13 and Q14 setting the collector voltages of Q11 and Q12 well into the active region, loops A and B settle out with equal currents through Q11 and Q12. Since $I_P$ is PTAT and the current through R13 and R14 are equal, Q15 operates at $2I_P$ and the voltage at the emitter of Q15 is $V_{BE} + V_{PTAT}$ where $$V_{PTAT} = (R_c/R11) V_T \ln A.$$

The cell comprised of transistors Q11 and Q12 and resistors R13 and R14 has a voltage gain which is the product of the transconductance ($g_m$) of the cell times $R_c$. There is a net transconductance from the base of Q12 to the bases of Q13 and Q14 because an incremental voltage applied to the base of Q12 will induce a differential voltage at the bases of Q13 and Q14. Ideally, the gain should be as high as possible to desensitize the circuit to uncertainties in the absolute $V_{BE}$'S of Q13 and Q14, which in turn reflects in uncertainties in the currents through Q11 and Q12. The gain can be increased by making the value of $R_c$ large. However, too much gain results in excessive voltages at the emitter of Q15. In the preferred embodiment, $V_{PTAT}$ across R13 and R14 is set to approximately 500 mV. Thus, the base of Q15 settles out at $2V_{BE}+V_{PTAT}$ which is approximately 2.2 volts. This leaves about 500 mV of headroom for the current source CS1 for a 2.7 Volt power supply.

It should be noted that the bases of Q15 and Q16 can operate at different voltages without compromising the effectiveness of Q13 and Q14. This is because current sources CS1 and CS2 maintain constant current through Q13 and Q14 which renders $V_{BE}$ of Q13 and Q14 substantially independent of collector voltage. With collector current held constant, the collector-emitter voltage $V_{CE}$ generally only influences $V_{BE}$ through Early voltage modulation according to the equation: $\Delta V_{BE}=\Delta V_{CE}/K$ where K is the forward Early voltage ($V_{AF}$) divided by the thermal voltage ($V_T$). K typically has a value of approximately 2000, so if $\Delta V_C$ is as much as 500 mV, the $\Delta V_{BE}$ is only about 0.25 mV.

One advantage of this circuit configuration is that currents I1 and I2 generated by current sources CS1 and CS2 need not have very accurate absolute values. The circuit is very robust over a wide range of values for I1 and I2. Further, I1 and I2 need not be very well balanced either. This is because a difference in I1 and I2 will only result in a slight $\Delta V_{BE}$ in Q13 and Q14. Because Q11 and Q12 are operated at constant current, this produces only a slight $\Delta V_{BE}$ between Q11 and Q12 due to the minimal effects of the Early voltage modulation discussed above. Another advantage of this reference cell is that it does not require any additional circuitry to assure proper start-up over the entire operating range.

There are numerous methods for implementing the current sources CS1 and CS2 because the accuracies are not critical. Although lateral PNP transistors have poor β and frequency characteristics, they can be used for CS1 and CS2 because the current sources only produce low level DC currents.

Figure 20:
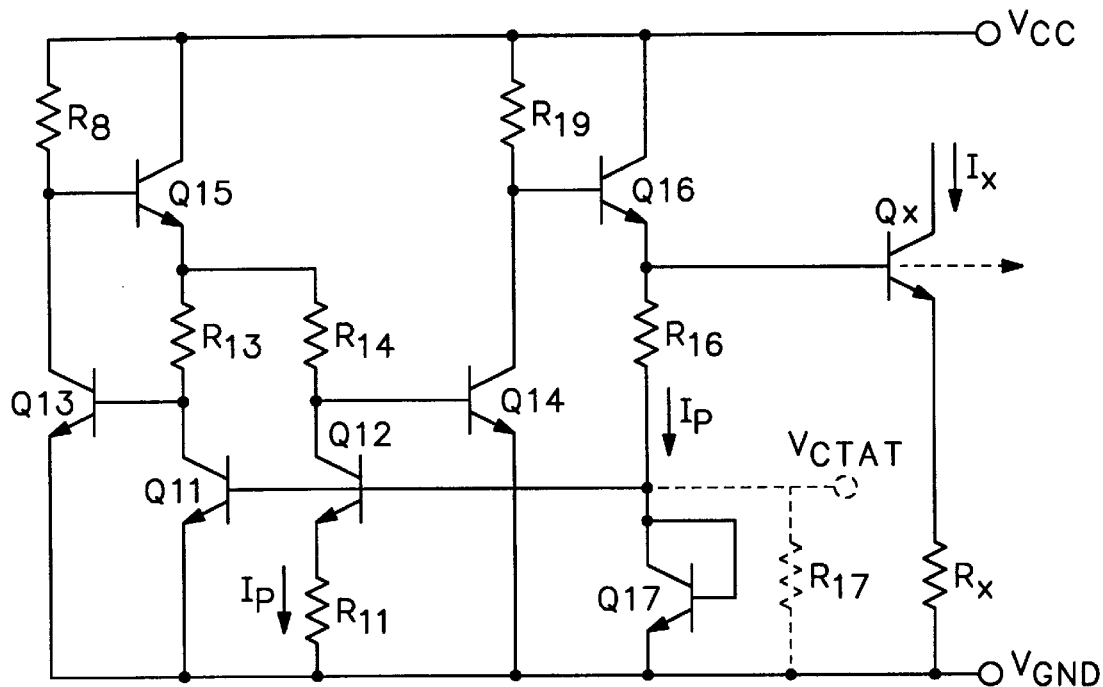
FIG. 20 is a schematic diagram of a second prior art biasing circuit reference cell.

To avoid PNP transistors altogether, resistors can be substituted for CS1 and CS2 as shown in FIG. 20, which shows another prior art variation on this bandgap reference cell. The current sources CS1 and CS2 of the embodiment of FIG. 19 are realized by resistors R18 and R19. Resistor R18 is connected between the base of Q15 and $V_{CC}$, and resistor R19 is connected between the base of Q16 and $V_{CC}$. The emitter of Q16 is no longer directly connected to the base terminals of Q11 and Q12, but instead a resistor R16 is connected between the emitter of Q16 and the base terminals of Q11 and Q12. The emitter of an NPN transistor Q17 is connected to $V_{GND}$ and the base and collector terminals of Q17 are shorted together and connected to the base of Q12. Because $V_{BE}$ of Q17 is the same as $V_{BE}$ of Q11, the current through Q17 is $I_P$. Ignoring the base currents through Q11 and Q12, the current through R16 will also be $I_P$ which is PTAT, and thus the voltage across R16 will be PTAT.

It should be noted that if $R16=R_C$, where $R_C$ is the resistance of R13 and R14, then the voltages at the bases of Q15 and Q16 are the same. This improves the balance of the $V_{BE}$'S of Q13 and Q14.

If the base terminal of an NPN transistor $Q_X$ is connected to the emitter of Q16 and the emitter of $Q_X$ is connected to $V_{GND}$ through a resistor $R_X$, then the $V_{BE}$'S of Q17 and $Q_X$ (which are CTAT) cancel and the voltage across R16 necessarily appears across $R_X$. Since the voltage across R16 is PTAT, the voltage across $R_X$ is also PTAT, and therefore, the current $I_X$ through $Q_X$ is PTAT. Thus $Q_X$ can be used to generate a bias current for other components that is proportional to absolute temperature.

If a bias current that is stable with temperature is required, a resistor R17 can be connected between the base of Q12 and $V_{GND}$. Since the voltage across R17 is $V_{BE}$, the current through R17 is CTAT. Ignoring base currents in Q11 and Q12, the currents through R16 are the sum of the currents through Q17 which is PTAT and R17 which is CTAT. By proper selection of resistor values, the voltage across R16 can be made stable with temperature. Since $V_{BE}$ for Q17 and $Q_X$ cancel, the voltage across $R_X$ is stable with temperature as is the current $I_X$ through $Q_X$. Several biasing transistors $Q_X$ can be connected in parallel to generate multiple biasing current sources.

Figure 21:
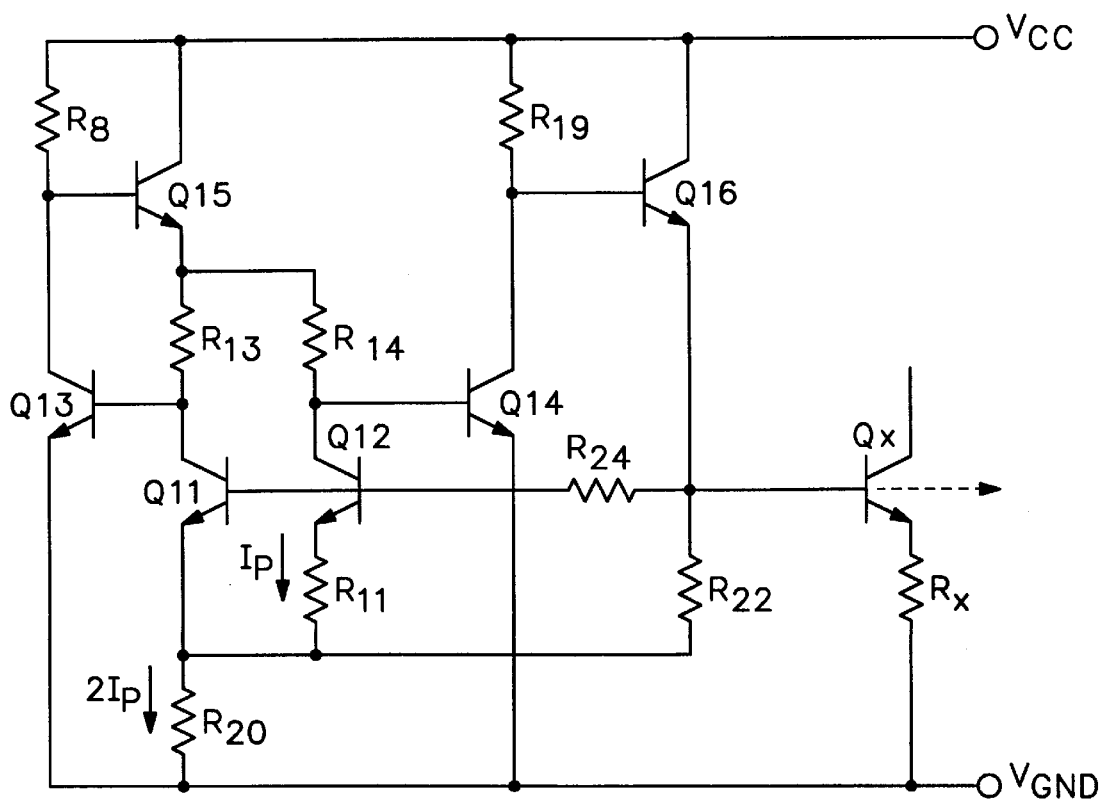
FIG. 21 is a schematic diagram of a third prior art biasing circuit reference cell.

Another prior art variation of a bandgap reference cell is shown in FIG. 21. A resistor R20 is connected between the emitter of Q11 and $V_{GND}$. The emitter of Q12 is connected to the emitter of Q11 through R11. The current sources CS1 and CS2 are realized by resistors R18 and R19 as in the embodiment shown in FIG. 19. Since the current through Q11 and Q12 are equal, then (neglecting the effect of R22) the current through R20 is twice the current through R11. Since $I_P$, the current through R11, is PTAT, the voltage across R20 is also PTAT.

If the base terminal of an NPN transistor $Q_X$ is connected to the emitter of Q16 and the emitter of $Q_X$ is connected to $V_{GND}$ through a resistor $R_X$, then the $V_{BE}$'S of Q11 and $Q_X$ (which are CTAT) cancel and the voltage across R20 necessarily appears across $R_X$. Since the voltage across R20 is PTAT, the voltage across $R_X$ is also PTAT, and therefore, the current $I_X$ through $Q_X$ is PTAT. Thus $Q_X$ can be used to generate a bias current for other components that is proportional to absolute temperature. A resistor R22 can be connected between the emitter of Q16 and the emitter of Q11 to minimize the temperature coefficient of the bias current. A resistor R24 can be connected between the emitter of Q16 and the base of Q12 to compensate for the finite current gain of biasing transistor $Q_X$.

Integration of All-NPN Bias Cell and RF Input Section

Figure 22:
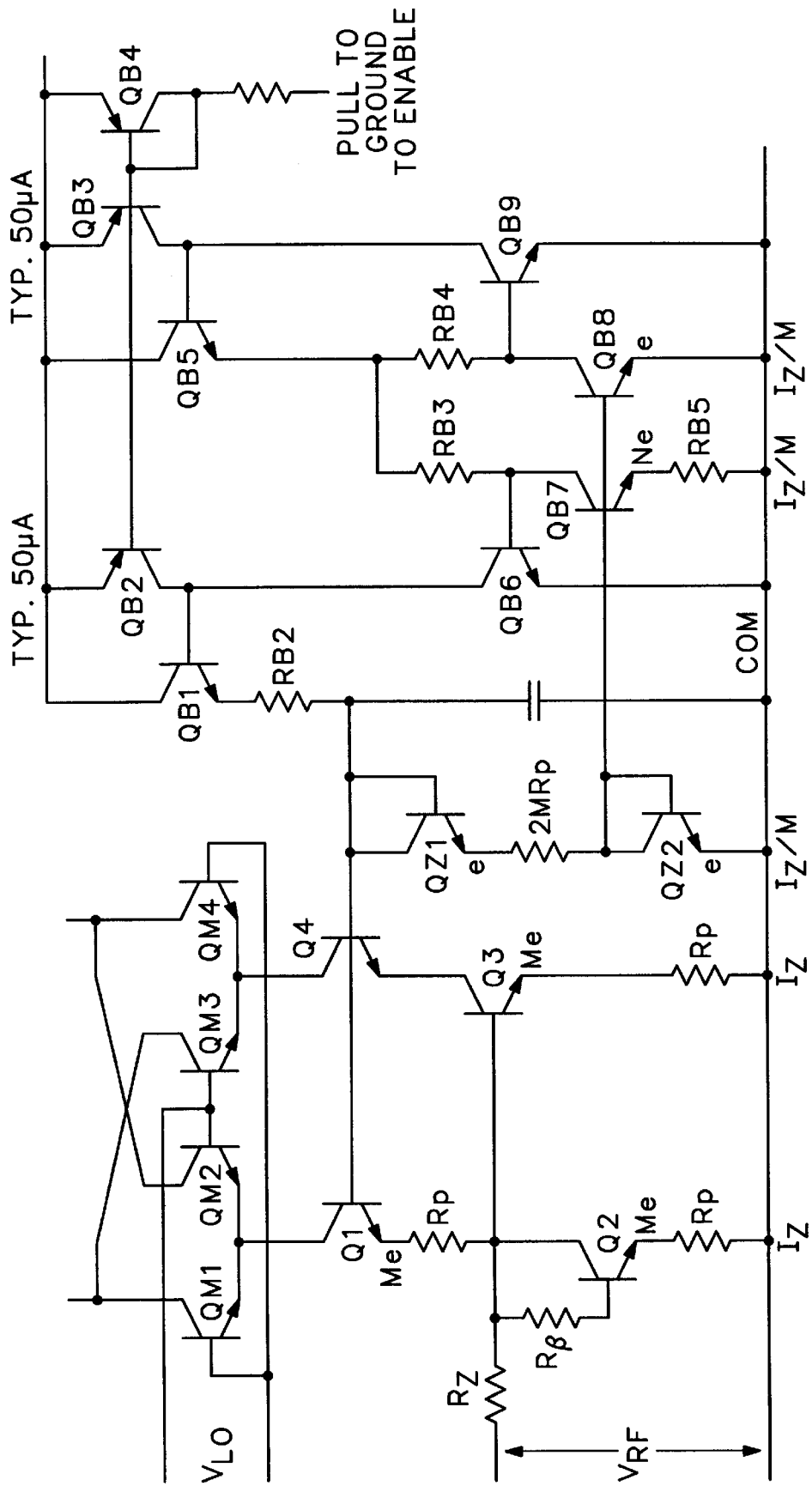
FIG. 22 is a schematic diagram of a scheme for integrating a prior art biasing circuit into the RF input stage shown in FIG. 11 in accordance with the present invention.

FIG. 22 shows a scheme for integrating a prior art biasing circuit such as that shown in FIG. 19 into the RF input stage shown in FIG. 11. The biasing system shown in FIG. 22 is based on an all-NPN $\Delta V_{BE}$ (PTAT) cell. In an optimal realization, all resistors would have good absolute accuracy low temperature coefficient with a view to tight control of $R_{IN}$. The core of this cell is QB7, QB8 and RB5. Loads RB3 and RB4 are equal. The dual-loop amplifier establishes $IC7=IC8=(V_T \log N)/RB5$. The current density in QB8 is replicated in QZ2 and becomes M times larger in Q1–Q4. Thus, $R_{IN}=R_Z+\{RB5/M\log(N)+R_P\}/2$. Transistors QB2–QB4 provide a cell-enable feature. They are entirely non-critical, operating at low currents, and can be realized as lateral PNP devices. They may optionally be replaced by resistors if the enable feature is not required.

Inductive Degeneration

Figure 15:
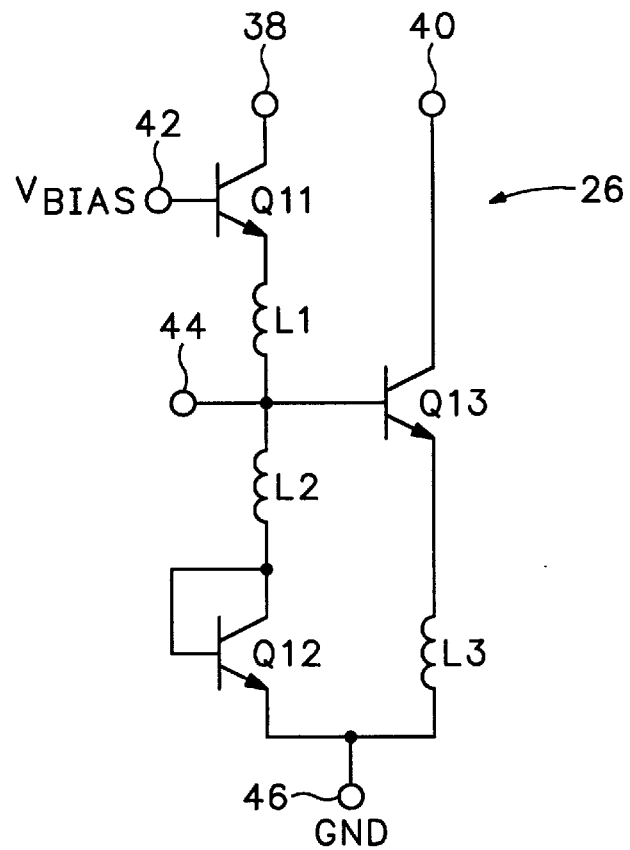
FIG. 15 is a schematic diagram of another embodiment of an RF input section in accordance with the present invention.

FIG. 15 shows another embodiment of an RF input section (or "cell") 26 for use with a mixer core such as that shown in FIG. 3. The RF input section of FIG. 15 includes padding (or "degeneration") inductors L1 and L2 which replace the padding resistors in the circuit of FIG. 7. Inductor L1 is inserted between the emitter of transistor Q11 and the RF input terminal, and inductor L2 is inserted between the RF input terminal and the collector of the diode connected transistor Q12. Transistor Q11 and inductor L1 can be viewed as a subcell or "half circuit", while the current mirror formed by Q12 and Q13, along with L2 and L3 can be viewed as another subcell or half circuit Inductors L1 and L2 extend the dynamic range of the mixer by providing degeneration impedances which extend the high end of the dynamic range. Further, because the inductors do not introduce the noise associated with padding resistors, they also extend the low end of the dynamic range.

The circuit of FIG. 15 is particularly suited to use in monolithic circuits for microwave applications because the low Q typical of monolithic inductors is not a disadvantage here. Using typical metallization technologies, the series resistance is of the order of 1 ohm per nanohenry (nh). Thus, the inductive reactance and resistance have the same magnitude at a frequency which is the solution of the equation $2\pi fx(nH)+\times(\Omega)$, or, $f\approx 160$ MHz. Accordingly, these components remain essentially inductive above this corner frequency. It should also be noted that the metalization resistance is roughly proportional to absolute temperature (PTAT), so the Johnson noise increases in direct proportion to temperature, not as the square root.

Figure 16:
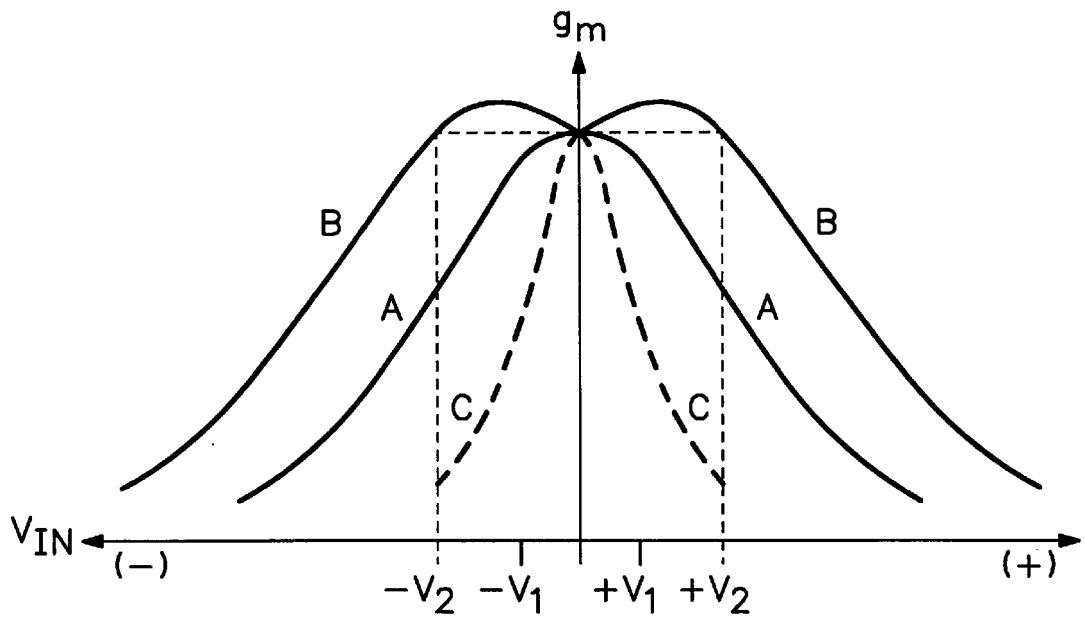
FIG. 16 is graph showing curves of the transconductance versus input voltage for various values of padding impedance in the circuit of FIG. 15.

By selecting specific inductance and resistance values for L1 and L2, the distortion characteristics of the circuit of FIG. 15 can be optimized for a particular range of input signals. This is illustrated in FIG. 16 which shows curves of the transconductance ($g_m$) versus input voltage for various values of padding impedance. The curve labeled "A" shows the transconductance versus input voltage for the case in which the magnitude of the impedance (including the reactive and resistive components) of L1 and L2 are chosen optimally. This can be viewed as an "ideal" case in the sense that there is zero curvature, and thus no distortion, at the origin. However, the input voltage can only vary between −v1 and +v1 before the distortion becomes significant.

The curve labeled "B" shows a case in which the impedance of L1 and L2 are chosen to be greater than optimal. In this case, there is some curvature, and thus some distortion, at the origin, but curve is still fairly flat between −v2 and +v2. Therefore, even though there is higher distortion for small signals, the component values that produce curve "B" allow the mixer to operate with a wider range of input voltages. The curve labeled "C" shows the transconductance versus input voltage for a case in which there is neither resistive nor inductive padding, and is included for purposes of comparison.

The circuit of FIG. 15 is particularly suited to narrowband applications because the inductors cause a frequency dependence in the gain characteristic. The circuit of FIG. 15 provides the benefit of higher intermodulation intercepts, while keeping the noise figure low.

Figure 27:
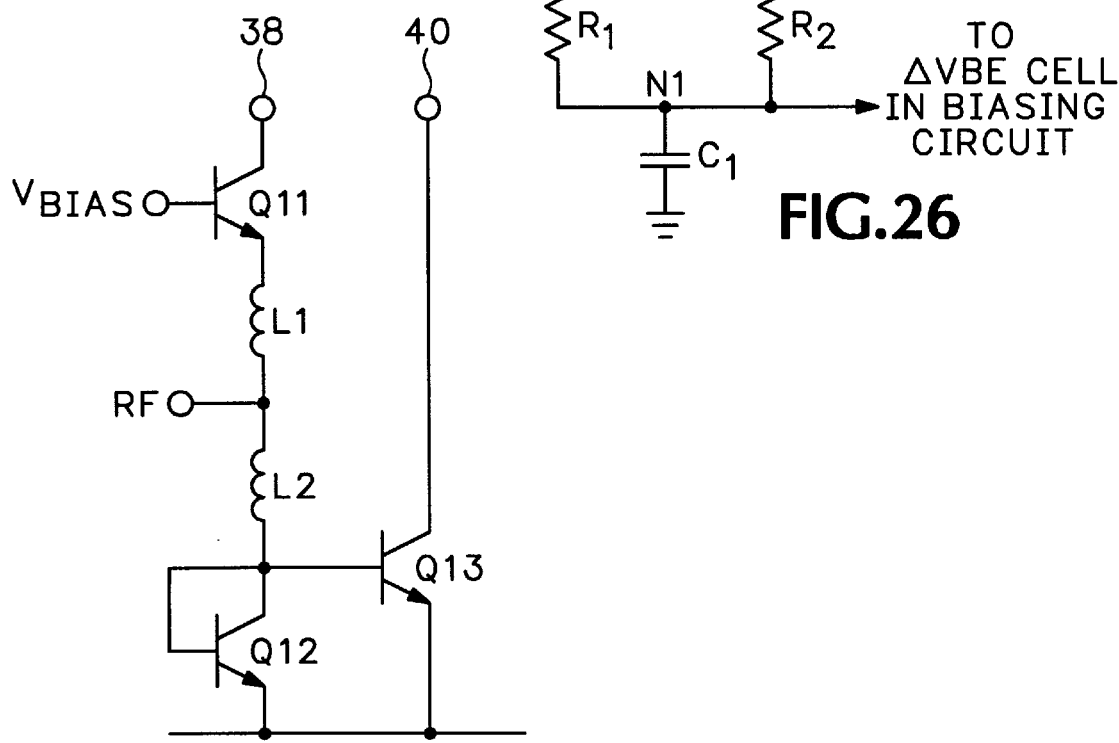
FIG. 27 is a schematic diagram of another embodiment of an RF input section in accordance with the present invention.

Inductors L2 and L3 provide inductive degeneration for the current mirror formed by transistors Q12 and Q13, thereby lowering the noise of the current mirror. However, in applications in which the current mirror noise can be tolerated, the circuit can be modified by removing inductor L3, connecting the emitter of Q13 to node 46, and connecting the base of Q13 to the collector of Q12 instead of the RF input node as shown in FIG. 27. This saves the chip area required for inductor L3.

Figure 17:
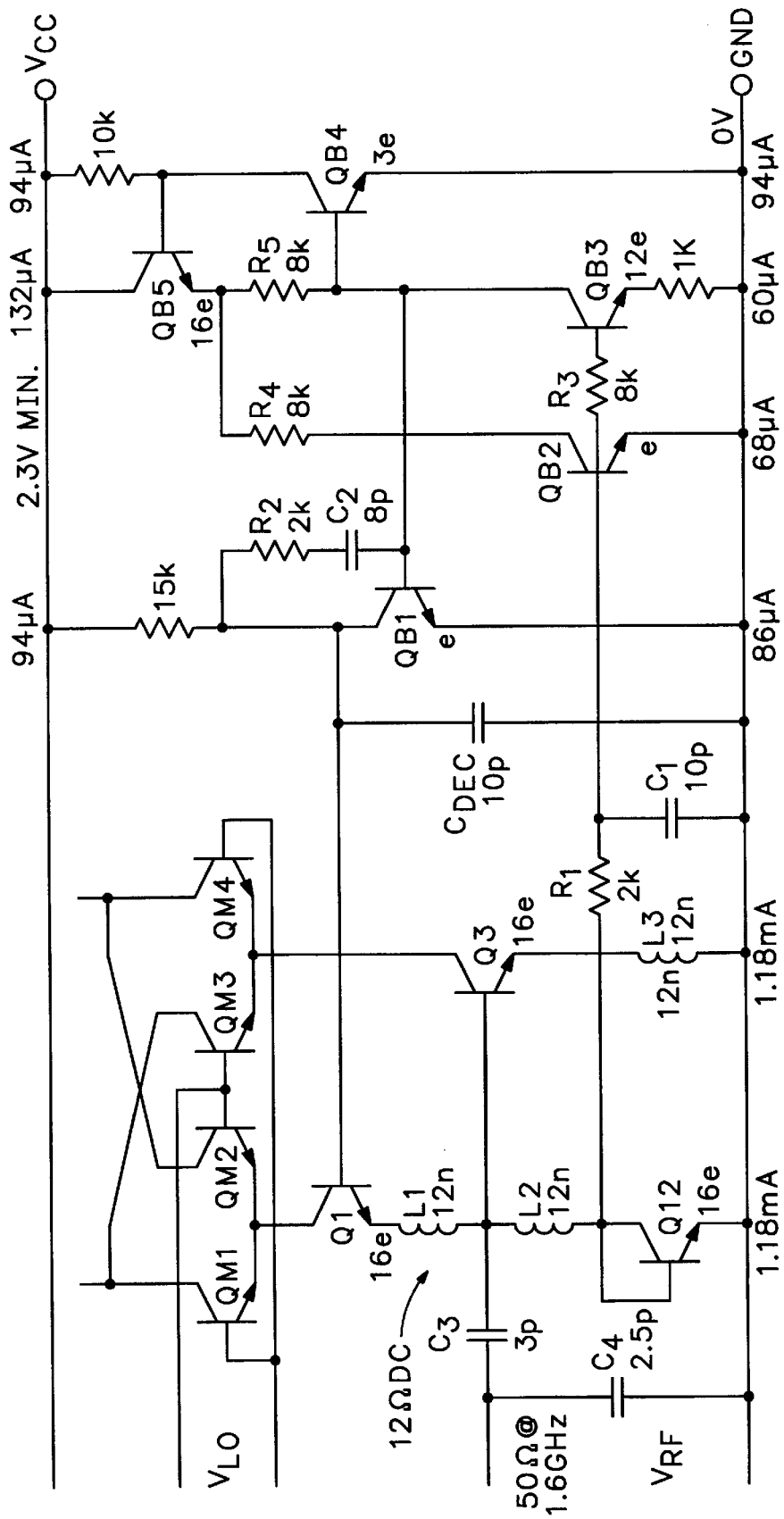
FIG. 17 is a schematic diagram of an exemplary embodiment of an inductively padded mixer which incorporates an all NPN biasing circuit.

FIG. 17 shows an exemplary embodiment of an inductively padded mixer which incorporates an all NPN bias circuit similar to that shown in FIG. 19. The current values shown in FIG. 17 are steady state values for a power supply voltage Vcc of 3.0 volts. The "e" values at each transistor specify the relative emitter areas of each transistor. The component values shown in FIG. 17 provide a purely resistive input impedance of 50 ohms at 1.6 GHz for the optimum bias current of 1.18 mAP, at which current density the transistors typically exhibit an $f_T$ of about 18 GHz for a representative technology.

Compared to the scheme shown in FIG. 22, the biasing circuit shown in FIG. 17 is more tightly integrated into the RF input stage. The common base transistor Q1 in FIG. 17 now also performs the function of the emitter follower transistor QB1 of FIG. 22. The current in Q2 is set up by using it as the current-sensor in the loop enclosing the $\Delta V_{BE}$ cell, QB2–QB3. An advantage of this method is that it eliminates the effect of the inductor resistance which is typically not well characterized for a monolithic circuit. Thus, it eliminates the two additional inductors which would be required in place of resistor 2MRp in the scheme of FIG. 22. Another advantage of the circuit of FIG. 17 is that it also eliminates a $V_{BE}$ from the bias circuit, thereby allowing it to operate at a reduced minimum power supply voltage of about 2.3 volts.

Since the signal at the collector of Q2 in FIG. 17 includes a component due to the input signal, as well as the bias portion, an RF filter formed by R1 and C1 is typically necessary to filter out the input portion of the signal and thereby prevent the bias cell from trying to track the input signal. Since the filter formed by R1 and C1 forms a pole in the feedback loop of the bias cell, a compensating filter formed from series-connected R2 and C2 is inserted between the base and collector of QB1 to create a zero to compensate for the pole created by R1 and C1.

Resistor R3 ensures accurate biasing in the presence of varying beta by compensating for the presence of the necessary resistance of R1 which affects the base current of QB2 and QB3. Also, the $\Delta V_{BE}$ arising across the bases of QB1 and QB4 is reflected back to the effective $\Delta V_{BE}$ of QB2 and QB3. The emitter area ratio between QB1 and QB4 may optionally by adjusted to effect a vernier adjustment of $\Delta V_{BE}$.

The improved scheme for integrating the biasing circuit into the RF input section shown in FIG. 17 can also be adapted for use with a resistively padded RF input section such as those shown in FIGS. 9, 11, and 22.

Figure 25A:
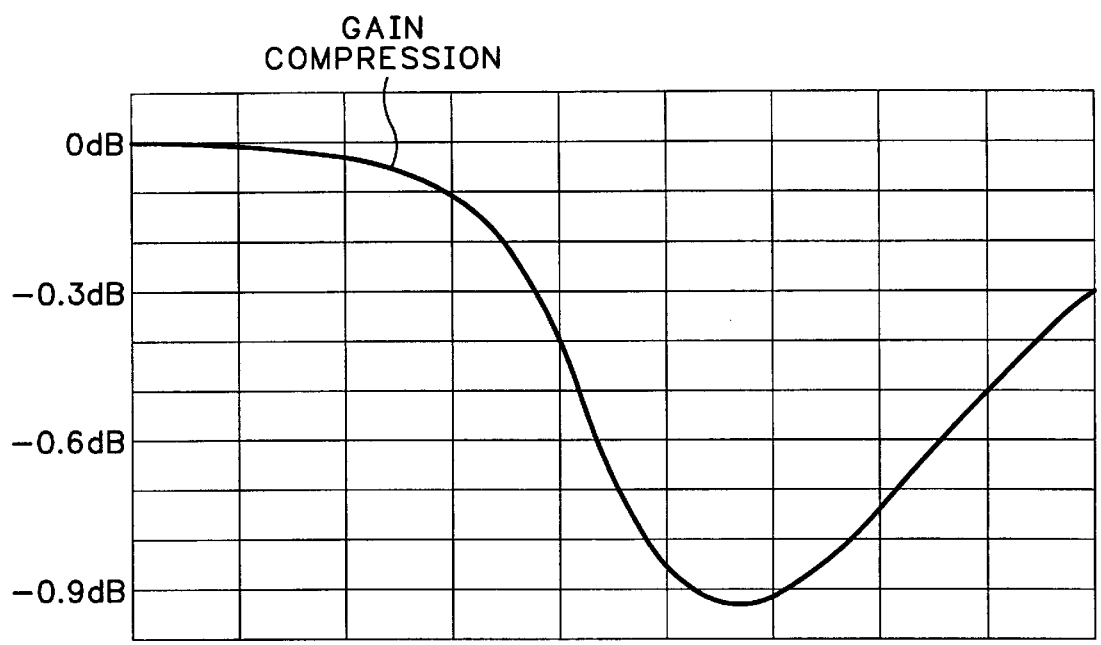
FIG. 25A is a graph showing the harmonic signature of the circuit of FIG. 17.
Figure 25B:
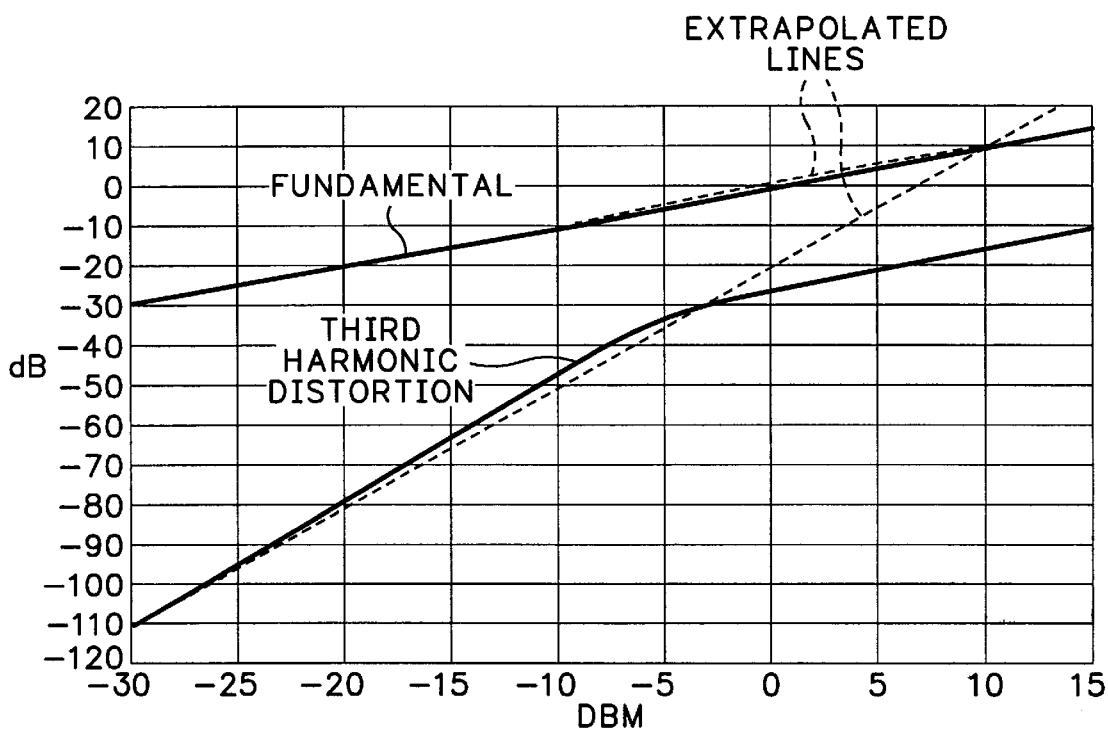
FIG. 25B is a graph showing the input-referred single-tone third order intercept and the noise-spectral-density for the circuit of FIG. 17.

FIG. 25A, shows the harmonic characteristic of the circuit of FIG. 17 which shows a dip in the fundamental to −0.93 dB at an input of about −2 dBm (referred to 50 ohms) before rising again. FIG. 25B shows that the input-referred single-tone third order intercept is at +10.2 dBm. The noise-spectral-density is 1.22 nV/√Hz corresponding to an amplifier-mode noise-figure of 2.6 dB.

When the circuit of FIG. 17 is embedded in an integrated circuit package, attention must be paid to complications arising from lead inductances and their mutual coupling, as well as the parasitic capacitances associated with the input paths, including those due to ESD devices. To reduce the effects of lead inductances and parasitics, several bond wires can connected between several pads and the header, and then at the edge of the pad on the pin side, multiple pins can also be bonded to the header which then forms a ground plane that reduces the impedance.

Figure 26:
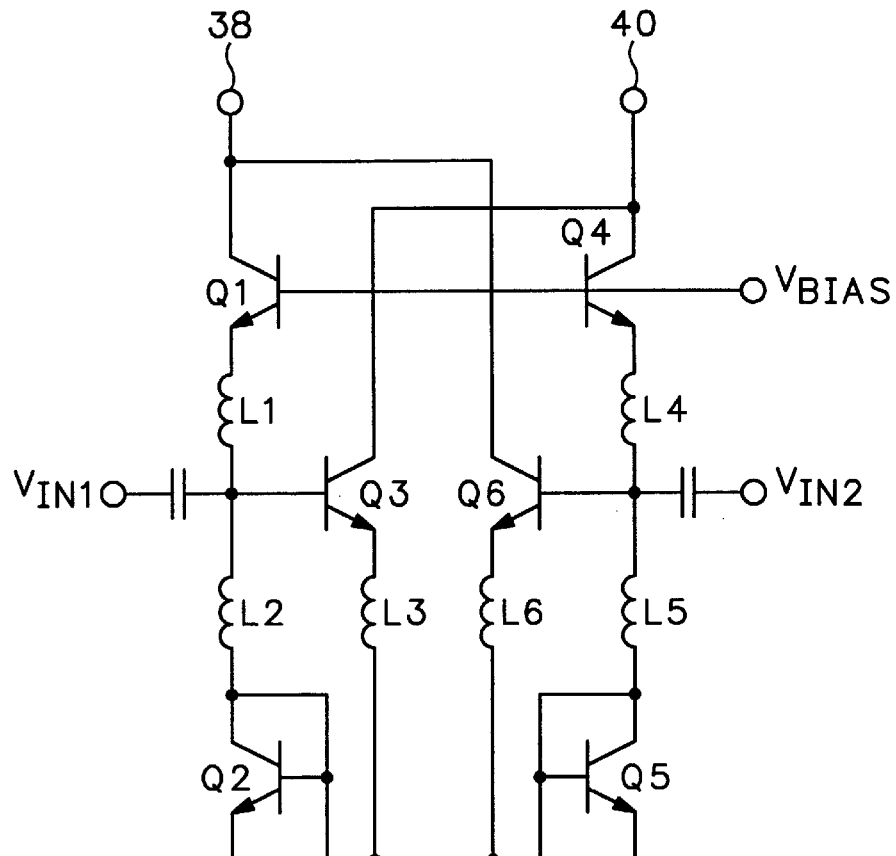
FIG. 26 shows another embodiment of an inductively degenerated RF input stage in accordance with the present invention.

FIG. 26 shows another embodiment of an inductively degenerated RF input stage (or "cell") 26 constructed in accordance with the present invention. The circuit of FIG. 26 employs two RF stages similar to that shown in FIG. 17 in a differential manner and employs the same scheme for tightly coupling the biasing circuit with the node N1 serving as the point for sensing the bias current. Referring to FIG. 26, variations in the voltages at the bases of Q2 and Q5 are of opposite sign. Resistors R1 and R2 are necessary to disconnect the bases of Q2 and Q5, but the voltage at node N1 is substantially unaffected by the input signal because it is fully differential across Q2 and Q5 in the case where magnitude of the $V_{IN1}$ and $V_{IN2}$ are equal. This reduces the filter requirements for the feedback path to the $\Delta V_{BE}$ cell.

The circuit of FIG. 26 effects further improvement in linearity through a cancellation process based on symmetry and component matching. Both the noise spectral density and signal handling capacity of this circuit are increased. The input impedance measured between the two "floating" input nodes—can be readjusted to any desired value. For example, each half could be adjusted to 25 ohms to present a 50 ohm input impedance. A balanced-to-unbalanced (BALUN) converter would typically be required to provide differential drive voltages.

Alternatively, inductors L3 and L6 can be removed, and the bases of Q3 and Q6 connected to the bases of Q2 and Q5, respectively, for operation without inductive degeneration in the current mirrors.

Figure 18:
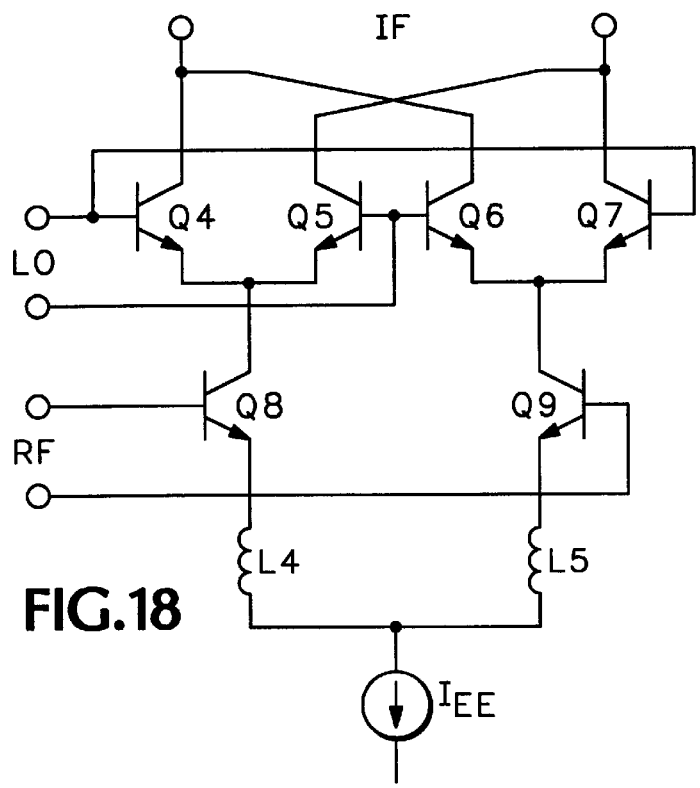
FIG. 18 is a schematic diagram of an embodiment of an improved doubly balanced mixer constructed in accordance with the present invention.

FIG. 18 shows an embodiment of an improved doubly balanced mixer constructed in accordance with the present invention. The mixer of FIG. 18 includes an RF input section or cell having a differential pair of emitter coupled transistors Q8 and Q9 and degeneration inductors L4 and L5 in series with the emitters of Q8 and Q9, respectively. Transistor Q8 and inductor L4 can be viewed as a subcell or "half circuit", while transistor Q9 and inductor L5 can be viewed as another subcell or half circuit.

It is well known that the use of degeneration resistors with a doubly balanced mixer extends the dynamic range of the mixer. However, the noise introduced by the resistors increases the noise at low input voltages and prevents the benefits of degeneration from being fully realized. The inductors L4 and L5 in FIG. 18 boost the dynamic range of the circuit without a noise penalty.

Inductively Degenerated Current Mirror

Figure 23:
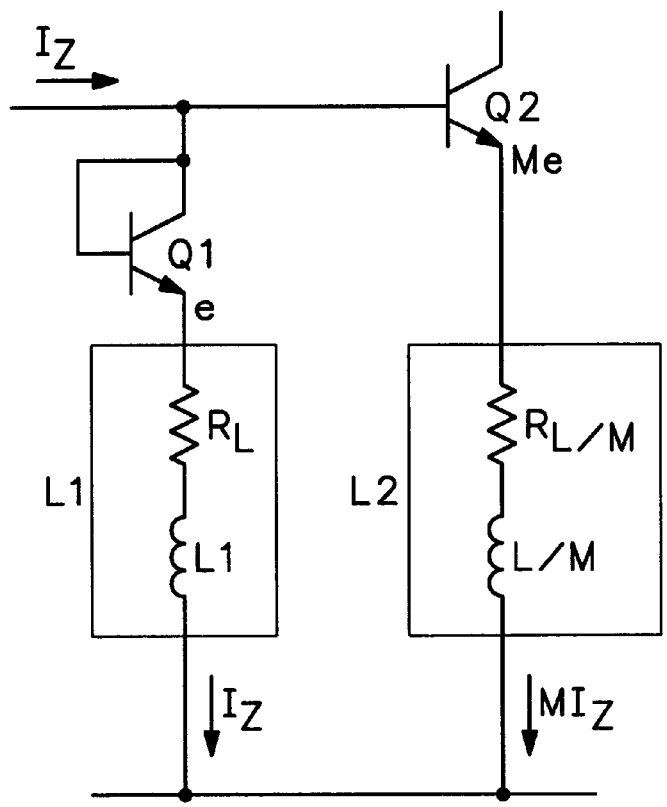
FIG. 23 is a schematic diagram of an inductively degenerated current mirror in accordance with the present invention.

The inductively degenerated current mirror formed by transistors Q12 and Q13 and inductors L2 and L3 of the circuits of FIGS. 15 and 17 is also useful as a low noise current mirror in applications other than RF mixers. FIG. 23 shows a generalized form of an inductively degenerated current mirror in accordance with the present invention. The current mirror of FIG. 23 includes a diode connected transistor Q1 having a collector and base connected together to receive a bias current having a value of $I_Z$. Transistor Q1 also has an emitter having an area "e" connected to a common node through a first inductor L1 having an inductance L. A second transistor Q2 has an emitter having an area of "Me" connected to the common node through a second inductor L2 having an inductance L/M where M is the ratio of the emitter areas of Q1 and Q2. Transistor Q2 also has a collector for receiving the mirror current having a value MIz and a base connected to the base of Q1. In practice, the first and second inductors L1 and L2 will have some resistance which should be maintained at $R_L$ and $R_L/M$, respectively, to maintain balance between the two halves of the mirror. The inductive degeneration of the circuit of FIG. 23 improves the noise characteristics of the current mirror and is particularly suited to monolithic implementation because of the importance of matching transistors and because resistance in the on-chip inductors is tolerable.

Figure 24:
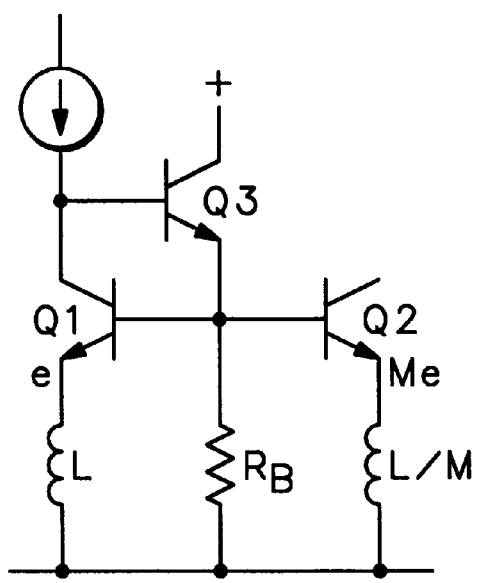
FIG. 24 shows a second embodiment of an inductively degenerated current mirror in accordance with the present invention.

FIG. 24 shows a more sophisticated embodiment of a general purpose inductively degenerated current mirror constructed in accordance with the present invention. The circuit of FIG. 24 is similar to that of FIG. 23 except that the base of transistor Q1 is not connected to its collector, but instead is connected the emitter of an emitter follower transistor Q3 which has a base connected to the collector of Q1 and a collector connected to a positive power source. A biasing resistor $R_B$ is coupled between the emitter of Q3 and the common node. The emitter follower Q3 augments the current gains of transistors Q1 and Q2.

Having described and illustrated the principles of the invention in a preferred embodiment thereof, it should be apparent that the invention can be modified in arrangement and detail without departing from such principles. I claim all modifications and variations coming within the spirit and scope of the following claims.

I claim:

1. An RF mixer comprising:
 a mixer core having an LO port for receiving an LO signal, an IF port for providing an IF output signal, and an input port having first and second input terminals for receiving first and second current signals; and
 an RF input section coupled to the input port for providing the current signals responsive to an RF input signal;
 wherein the RF input section includes:
   a first transistor coupled to the first input terminal,
   a second transistor coupled to receive the RF input signal, wherein the second transistor is diode-connected,
   a third transistor coupled to the second transistor and the second input terminal and arranged to form a current mirror with the second transistor, and
   an inductor coupled to the first transistor to extend the dynamic range of the mixer; and
 wherein the first transistor is configured for operation in common base mode.

2. An RF mixer comprising:
 a mixer core having a first input terminal for receiving a first current signal and a second input terminal for receiving a second current signal;
 a first subcell coupled to the first input terminal of the mixer core to provide the first current signal to the mixer core responsive to an RF input signal, the first subcell having a first transistor and a first inductor coupled to the first transistor to extend the dynamic range of the mixer; and
 a second subcell coupled to the second input terminal of the mixer core to provide a second current signal to the mixer core responsive to an RF input signal, the second subcell having a second transistor and a second inductor coupled to the second transistor to extend the dynamic range of the mixer;
 wherein:
   the first transistor includes a first terminal coupled to the first input terminal, a second terminal coupled to receive a reference signal, and a third terminal;
   the inductor includes a first terminal coupled to the third terminal of the first transistor and a second terminal coupled to receive the RF input signal
   the second transistor is diode connected; and
   the second inductor is arranged to degenerate the transconductance of the second transistor; and
 wherein the second subcell further includes a third transistor coupled to the second transistor and the second input terminal and arranged to form a current mirror with the second transistor.

3. An RF mixer according to claim 2 wherein the magnitude of the impedance of each inductor is greater than $r_e/2$ where $r_e$ is the incremental resistance of the transistors.

4. An RF mixer according to claim 2 wherein the second subcell further includes a third inductor arranged to degenerate the transconductance of the third transistor.

5. A current mirror comprising:
 a first transistor having a first terminal for receiving an input signal, a second terminal coupled to the first terminal of the first transistor to cause the first transistor to operate as a diode, and a third terminal;

a first inductor coupled between the third terminal of the first transistor and a common node to reduce the noise of the current mirror;

a second transistor having a first terminal for transmitting an output signal, a second terminal coupled to the first terminal of the first transistor, and a third terminal; and a second inductor coupled between the third terminal of the second transistor and a common node to reduce the noise of the current mirror.

6. An RF amplifier comprising:

a first transistor coupled between a first node and a common node in a diode configuration;

a second transistor having a first terminal for transmitting an output signal, a second terminal, and a third terminal coupled to a second node;

a passive component coupled between the first and second nodes;

a delta-Vbe cell referenced to the common node and having first and second load input terminals for loading the cell, and a sense terminal coupled to the first node for sensing the voltage across the first transistor; and a third transistor having a first terminal coupled to the common node, a second terminal coupled to the second load input terminal, and a third terminal coupled to the second terminal of the second transistor to provide a bias signal to the second transistor.

7. An RF amplifier according to claim 5 further including a resistor coupled between the third terminal of the third transistor and a power supply node.

8. An RF amplifier according to claim 5 further including a filter coupled between the second and third terminals of the third transistor.

9. An RF amplifier according to claim 5 further including a filter coupled between the first node and the sense terminal of the delta-Vbe cell.

10. An RF input section for a mixer, the RF input section comprising:

a first output terminal for coupling a first current to a mixer core;

a second output terminal for coupling a second current to the mixer core;

a first transistor having a first terminal coupled to the first output terminal, a second terminal coupled to receive a bias signal, and a third terminal;

a first inductor coupled between the third terminal of the first transistor and an RF input terminal for receiving an RF input signal;

a diode;

a second inductor, wherein the diode and the second inductor are coupled in series between the RF input terminal and a common node; and a second transistor having a first terminal coupled to the second output terminal, a second terminal coupled to form a current mirror with the diode, and a third terminal coupled to the common node.

11. An RF input section according to claim 10 wherein the second terminal of the second transistor is coupled to the RF input terminal and further including a third inductor coupled between the third terminal of the second transistor and the common node.

12. An RF input section according to claim 10 wherein:

the diode has a first terminal coupled to the second inductor and a second terminal coupled to the common node; and the second terminal of the second transistor is coupled to the first terminal of the diode.

13. An RF input section according to claim 10 wherein:

the RF input section has a transconductance curve having an origin; and the magnitude of the impedances of the first and second inductors are adjusted to provide zero curvature in the transconductance curve at the origin, thereby providing no distortion at the origin.

14. An RF input section according to claim 10 wherein:

the RF input section has a transconductance curve having an origin;

the magnitude of the impedances of the first and second inductors have an optimum value that provides zero curvature in the transconductance curve at the origin; and the magnitude of the impedances of the first and second inductors are greater than the optimum value, thereby allowing the mixer to operate at a wider range of input voltages.

15. An RF input section for a mixer, the RF input section comprising:

a first output terminal for coupling a first current to a mixer core;

a second output terminal for coupling a second current to the mixer core;

a first transistor having a first terminal coupled to the first output terminal, a second terminal coupled to receive a bias signal, and a third terminal coupled to a first RF input terminal for receiving a first RF input signal;

a first diode coupled between the first RF input terminal and a common node;

a second transistor having a first terminal coupled to the second output terminal, a second terminal coupled to form a current mirror with the first diode, and a having a first terminal coupled to the first output terminal, a second terminal coupled to receive a bias signal, and a third terminal coupled to an RF input terminal for receiving an RF input signal;

a first diode coupled between the RF input terminal and a common node;

a second transistor having a first terminal coupled to the second output terminal, a second terminal coupled to form a current mirror with the diode, and a third terminal coupled to the common node;

a third transistor having a first terminal coupled to the second output terminal, a second terminal coupled to receive the bias signal, and a third terminal coupled to a second RF input terminal for receiving a second RF input signal;

a second diode coupled between the second RF input terminal and the common node;

a fourth transistor having a first terminal coupled to the first output terminal, a second terminal coupled to form a current mirror with the second diode, and a third terminal coupled to the common node.

16. An RF input section according to claim 15 further including:

a first inductor coupled between the third terminal of the first transistor and the first RF input terminal;

a second inductor coupled in series with the first diode;

a third inductor coupled between the third terminal of the third transistor and the second RF input terminal; and a fourth inductor coupled in series with the second diode.

17. An RF input section according to claim 15 further including:
   a fifth inductor coupled between the third terminal of the second transistor and the common node; and
   a sixth inductor coupled between the third terminal of the fourth transistor and the common node.

18. An RF input section according to claim 13 further including:
   a sense node resistively coupled to the first and second diodes;
   a delta-Vbe cell referenced to the common node and having first and second load input terminals for loading the cell, and a sense terminal coupled to the sense node;
   a third transistor having a first terminal coupled to the common node, a second terminal coupled to the second load input terminal, and a third terminal coupled to the second terminal of the first transistor to provide the bias signal.

19. A current mirror comprising:
   an input terminal;
   an output terminal;
   a common terminal;
   a diode-connected transistor;
   a first inductor, wherein the diode-connected transistor and the first inductor are coupled in series between the input terminal and the common terminal;
   a second transistor having a first terminal coupled to the diode-connected transistor to form a current mirror with the diode-connected transistor, a second terminal coupled to the output terminal, and a third terminal; and
   a second inductor coupled between the third terminal of the second transistor and the common terminal.

20. A current mirror according to claim 19 wherein:
   the diode-connected transistor has an emitter area of e;
   the second transistor has an emitter area of Me where M is a constant;
   the first inductor has an inductance of L; and
   the second inductor has an inductance of L/M.

21. A current mirror according to claim 20 wherein:
   the first inductor has a resistance of $R_L$; and
   the second inductor has a resistance of $R_L/M$.

22. A current mirror according to claim 19 further including a third transistor having a first terminal coupled to the input terminal and a second terminal coupled to the diode-connected transistor and the second transistor to augment the gains of the diode-connected transistor and the second transistor.

* * * * *